(12) United States Patent
Johnson et al.

(10) Patent No.: US 6,683,495 B2
(45) Date of Patent: Jan. 27, 2004

(54) REDUCED ARCHITECTURE FOR MULTIBRANCH FEEDFORWARD POWER AMPLIFIER LINEARIZERS

(75) Inventors: Thomas Johnson, British Columbia (CA); James K. Cavers, British Columbia (CA)

(73) Assignee: Simon Fraser University, Burnaby (CA)

(*) Notice: Subject to any disclaimer, the term of this patent is extended or adjusted under 35 U.S.C. 154(b) by 0 days.

(21) Appl. No.: 09/982,622

(22) Filed: Oct. 18, 2001

(65) Prior Publication Data

US 2003/0030487 A1 Feb. 13, 2003

Related U.S. Application Data

(60) Provisional application No. 60/301,978, filed on Jun. 28, 2001.

(51) Int. Cl.[7] ................................................. H03F 3/45
(52) U.S. Cl. ........................... 330/52; 330/151; 330/149; 330/124 R
(58) Field of Search ............................... 330/52, 124 R, 330/149, 151

(56) References Cited

U.S. PATENT DOCUMENTS

| | | | |
|---|---|---|---|
| 4,379,994 A | 4/1983 | Baumann | 330/149 |
| 4,879,519 A | 11/1989 | Myer | 330/149 |
| 5,130,663 A * | 7/1992 | Tattersall, Jr. | 330/52 |
| 5,157,345 A | 10/1992 | Kennington et al. | 330/149 |
| 5,307,022 A | 4/1994 | Tattersall, Jr. et al. | 330/52 |
| 5,485,120 A | 1/1996 | Anvari | 330/151 |
| 5,489,875 A * | 2/1996 | Cavers | 330/151 |
| 5,532,642 A | 7/1996 | Takai | 330/15 |
| 5,565,814 A | 10/1996 | Fukuchi | 330/52 |
| 5,610,554 A | 3/1997 | Anvari | 330/52 |
| 5,617,061 A | 4/1997 | Fukuchi | 330/151 |
| 5,621,354 A | 4/1997 | Mitzlaff | 330/52 |
| 5,644,268 A | 7/1997 | Hang | 330/151 |
| 5,694,395 A | 12/1997 | Myer et al. | 370/480 |
| 5,742,201 A | 4/1998 | Eisenberg et al. | 330/2 |
| 5,760,646 A | 6/1998 | Belcher et al. | 330/149 |
| 5,789,976 A | 8/1998 | Ghannouchi et al. | 330/52 |
| 5,815,036 A | 9/1998 | Yoshikawa et al. | 330/52 |
| 5,831,478 A | 11/1998 | Long | 330/52 |
| 5,862,459 A | 1/1999 | Charas | 455/144 |
| 5,867,065 A | 2/1999 | Leyendecker | 330/149 |
| 5,898,339 A * | 4/1999 | Maruyama et al. | 330/151 |
| 6,075,411 A * | 6/2000 | Briffa et al. | 330/149 |
| 6,166,601 A | 12/2000 | Shalom et al. | 330/151 |
| 6,208,207 B1 | 3/2001 | Cavers | 330/149 |
| 6,414,546 B2 | 7/2002 | Cavers | 330/149 |

FOREIGN PATENT DOCUMENTS

| | | |
|---|---|---|
| EP | 0675594 | 10/1995 |
| JP | 58-175309 | * 10/1983 |

OTHER PUBLICATIONS

Han et al. "Design and Characterization of a Microwave Feed–Forward Amplifier with Improved Wide–Band Distortion Cancellation" IEEE Transactions on Microwave Theory and Techniques vol. 49 Issue 1, Jan. 2001 pp 200–203.*

S. Grant, "A DSP Controlled Adaptive Feedforward Amplifier Linearizer," Jul., 1996.

(List continued on next page.)

*Primary Examiner*—Michael B Shingleton
(74) *Attorney, Agent, or Firm*—Fitzpatrick, Cella, Harper & Scinto

(57) ABSTRACT

An amplifier linearizer circuit has a signal cancellation circuit including a signal adjuster having M branch signals ($M \geq 1$), and a distortion cancellation circuit including a signal adjuster having N branch signals ($N \geq 1$). The linearizer has a controller for adaptively controlling the M-branch and N-branch signal adjusters. The controller has only one monitor receiver to monitor the M branch signals and only one monitor receiver to monitor the N branch signals.

7 Claims, 19 Drawing Sheets

OTHER PUBLICATIONS

S. Grant and J. Cavers, "A DSP Controlled Adaptive Feedforward Amplifier Linearizer," ICUPC 1996.

A. Smith, "A Wideband Adaptive Feedforward Amplifier Lineariser," Aug. 1997.

A. Smith and J. Cavers, "A Wideband Architecture For Adaptive Feedforward Linearization," May 18, 1998.

F. Amoroso, "Spectal Containment by PreDistortion of OQPSK Signal," Oct., 1998.

J. Cavers, "Adaption Behavior of a Feedforward Amplifier Linearizer," Feb., 1995.

Q. Cheng, et al., A 1.9 GHZ Adaptive Feedforward Power Amplifier, Nov. 1998.

J.C. Lagarias, et al., Convergence Properties of the Nedler-Mead Simplex Algorithm in Low Dimensions, SAIM J. Optim. May, 1997.

P.B. Kennington and D.W. Bennett, Linear Distortion Correction using Feed–forward System, IEEE Trasnactions on Vehicular Technology vol. 45 No. 1 (Feb. 1996).

J. Chen, et al., Adaptive joint lineraisation/equilisation with delay alignments for a wideband power amplifier, Mar., 1998.

J.T. Chen, H.S. Tsai and Y.K. Chen, Fast Adaptive Wideband Power Amplifier Feed–forward Linearizer, IEEE Vehicular Technology conference, Ottawa, (1998).

J.K. Cavers, Convergence Behavior of an Adaptive Feedforward Linearizer, IEEE Vehicular Technology Conference, (1994).

F.T. Luk and S. Qiao, Analysis of a Recursive Least-squares Signal Processing Algorithm, Society for Industrial and Applied Mathematics, vol. 10, No. 3, (May 1989).

S. Ljung and L. Ljung, Error Propagation Properties of Recursive Least-squares Adaptation Algorithms, Automatica, vol. 21, No. 2 (1985).

E. Eweda and O. Macchi, Convergence of the RLS and LMS Adaptive Filters, IEEE Transactions on Circuits and Systems, vol. CAS–34, No. 7, (Jul. 1987).

D.H. Shi and F. Kozin, On Almost Sure Convergence of Adaptive Algorithms, IEEE Transactions on Automatic Control, vol. AC–31, No. 5, (May 1986).

L.L. Horowitz and K.D. Seene, Performance Advantage of Complex LMS for Controlling Narrow–band Adaptive Arrays, IEEE Transactions on Acoustics, Speech, and Signal Processing, vol. ASSP–29, No. 3, (Jun. 1981).

G.A. Clark, S.K. Mitra, and S.R. parker, Block Implementation of Adaptive Digital Filters, IEEE Transactions on Acoustics, Speech, and Signal Processing, vol. ASSP–29, No. 3, (Jun. 1981).

A. Feuer, Performance Analysis of the Block Least Mean Square Algorithm, IEEE Transactions on Circuits and Systems, vol. CAS–32, No. 9, (Jul. 1985).

S.S. Narayan, A.M. Peterson, M.J. Narasimha, Transform Domain LMS Algorithm, IEEE Transactions on Acoustics, Speech, and Signal Processing, vol. ASSP–31, No. 3, (Jun. 1983).

G.A. Clark, S.R. Parker, and S.K. Mitra, A Unified Approach to Time–and Freqeuncy–Domain Realization of FIR Adaptive Digital Filters, IEEE Transactions on Acoustics, Speech, and Signal Processing, vol. ASSP–31, No. 5, (Oct. 1983).

G. Panda, B. Mulgrew, C.F.N. Cowan, and P.M. Grant, A Self–Orthogonalizing Efficient Block Adaptive Filter, IEEE Transactions on Acoustics, Speech, and Signal Processing, vol. ASSP–34, No. 6, (Dec. 1986).

J. Chao, H. Perez, and S. Tsujii, A Fast Adaptive Filter Algorithm Using Eigenvalue Reciprocals as Stepsizes, IEEE Transactions on Acoustics, Speech, and Signal Processing, vol. ASSP–38, No. 8, (Aug. 1990).

S.J. Elliot and B. Fafaely, Rapid Frequency–Domain Adaptation of Causal FIR Filters, IEEE Signal Processing Letters, vol. 4, No. 12, (Dec. 1997).

R.M. Gray, On the Asymptotic Eigenvalue Distribution of Toeplitz Matrices, IEEE Transactions on Information Theory, vol. IT–18, No. 6, (Nov. 1972).

M. Johansson and L. Sundstrom, Linearization of RF Multicarrier Amplifiers using Cartesian Feedback, Electronic Letters, vol. 30, No. 14, (Jul. 1, 1994).

* cited by examiner

REDUCED ARCHITECTURE FOR MULTIBRANCH FEEDFORWARD POWER AMPLIFIER LINEARIZERS

CROSS-REFERENCE TO RELATED APPLICATIONS

This application claims priority to U.S. Patent Application No. 60/301,978 filed Jun. 28, 2001, the contents of which are incorporated by reference.

FIELD OF THE INVENTION

This invention generally pertains to, but is not limited to, multibranch feedforward linearizers for amplifiers, for example, RF power amplifiers used in wireless communication systems.

BACKGROUND OF THE INVENTION

The operation of the multibranch feedforward linearizer shown in FIG. 1 can be described in terms of two circuits: a signal cancellation circuit 101 and a distortion cancellation circuit 102. When an adjuster circuit s 110 in the signal cancellation circuit 101 is set optimally, a linear estimate of the signal at the output of the power amplifier 103 is generated by the signal circuit cancellation paths and subtracted from the distorted power amplifier signal, $v_{pa}$. The residual error signal from the signal cancellation circuit, $v_e$, output from the subtractor 106, is the power amplifier distortion signal. (As will be appreciated by those skilled in the art, the elements shown in FIG. 1 as pickoff points and the elements shown as adders and subtractors may be implemented by directional couplers, splitters or combiners, as appropriate.)

The distortion cancellation circuit 102 subsequently adjusts the phase and amplitude of the distortion signal $v_e$ by adjuster circuit d 111 and error amplifier 108 to subtract it using subtractor 107 from the nonlinear output signal $v_{br}$, output from the delay line 112. This reduces the distortion in the final output signal ($v_o$) from the linearized amplifier. The desired output takes the role of an "error signal" in the distortion cancellation circuit 102. The level of distortion cancellation at the output of the linearized amplifier depends on how accurately adjuster circuits s 110 and d 111 are set, and how well those adjuster circuits track changes in the linearizer.

A notable variant of the multibranch feedforward linearizer is to place adjuster circuit s 109 in series with the power amplifier, as shown in FIG. 3, and to replace the adjuster circuit s 110 with a delay line 118. In this configuration, any additional distortion generated by adjuster circuit s 109 is cancelled by the feedforward linearizer. The hardware or software used to set the parameters of the adjuster circuits 109, 110, and 111 are the subject of this invention.

The degree of distortion cancellation—its depth and bandwidth—at the output of the linearized amplifier depends on the structure of adjuster circuits s 110 (or 109) and d 111. A general implementation of the adjuster circuit s 110 for a multibranch feedforward linearizer includes M parallel circuit branches summed by combiner 206 as shown in FIG. 2. Similarly, for adjuster circuit d 111, N parallel circuit branches are summed by a combiner 216 (see FIG. 6). In a single branch feedforward linearizer, the adjuster circuits s and d both have a single branch (M=1 and N=1, respectively), while at least one adjuster circuit in a multibranch linearizer has two or more branches, as shown in the examples of FIGS. 2 and 6. Each circuit branch of the adjuster circuit s shown in FIG. 2 has a linear filter element (200, 202, 204) with a frequency response $h_{aj}(f)$ (j=1 to M) in series with a complex gain adjuster (CGA) (201, 203 and 205). Similarly, each circuit branch of the adjuster circuit d shown in FIG. 6 has a linear filter element (210, 212, 214) with a frequency response $h_{bj}(f)$ (j=1 to N) in series with a CGA (211, 213 and 215). The linear filter elements $h_{aj}(f)$ and $h_{bj}(f)$ could be as simple as a delay or as complicated as a general linear filter function.

A multibranch feedforward linearizer has a significantly larger linearization bandwidth than a single branch feedforward linearizer, and the linearization bandwidth depends on the number of parallel branches in the adjuster circuits s 110 (or 109) and d 111. Single branch feedforward linearizers and multibranch feedforward linearizers are described in U.S. Pat. Nos. 5,489,875 and 6,208,207, both of which are incorporated by reference.

The CGAs in each branch of the adjuster circuit control the amplitude and phase of the signal in each branch. Two examples of CGA configurations are shown in FIGS. 4 and 5. The implementation shown in FIG. 4 uses polar control parameters GA and GB, where GA sets the amplitude of the attenuator 401, while GB sets the phase of the phase shifter 402. The implementation shown in FIG. 5 uses Cartesian control parameters, also designated GA and GB, where GA sets the real part of the complex gain, while GB sets the imaginary part of the complex gain. In this implementation, the input signal I is split into two signals by splitter 506, one of which is then phase-shifted by 90 degrees by phase shifter 503, while the other is not. After GA and GB are applied by mixers or attenuators 505 and 504 respectively, the signals are summed by combiner 507 to produce the CGA output signal O. U.S. Pat. No. 6,208,207 describes the use of linearization of these mixers and attenuators, so that desired values of complex gain can be obtained predictably by appropriate setting of the control voltages GA and GB.

A multibranch feedforward linearizer with M CGAs in the adjuster circuit s 110 of the signal cancellation circuit 101 and N CGAs in the adjuster circuit d 111 of the distortion cancellation circuit 102 is shown in FIG. 6. In this linearizer, an adaptation controller 114 computes the parameters $a_1$ through $a_M$ of the CGAs of the adjuster circuit s 110 and the parameters $b_1$ through $b_N$ of the CGAs of the adjuster circuit d 111, by monitoring internal signals of the adjusters s 110 and d 111, and the error signal, $v_e$, and the output signal, $v_o$. The internal signals of the adjusters s 110 and d 111 are respectively $v_{a1}$ through $v_{aM}$ and $v_{b1}$ through $v_{bN}$. The actual signals monitored by the adaptation controller are, however, $v_{am1}$ through $v_{amM}$ and $v_{bm1}$ through $v_{bmN}$, wherein the difference between these internal signals and the monitored signals is respectively represented by observations filters $h_{am1}(f)$ through $h_{amM}(f)$ (601, 602, 603) and $h_{bm1}(f)$ through $h_{bmN}(f)$ (605, 606, 607). Further, the respective differences between the error and output signals, $v_e$ and $v_o$, and the monitored error and output signals, $v_{em}$ and $v_{om}$, can be represented by observation filters $h_{em}(f)$ (604) and $h_{om}(f)$ (608). The differences between the internal (or error and output) signals and the monitored signals are gain and phase changes therebetween caused by hardware implementation of the signal lines and monitoring components, e.g., cables, circuit board traces, mixers, filters and amplifiers. As represented by the observation filters, these gain and phase changes may be frequency dependent. Calibration methods for relating the internal, error and output signals to their monitored counterparts are discussed below.

The nonlinear power amplifier in the circuit is linearized by adjusting the M CGAs in the signal cancellation circuit and the N CGAs in the distortion cancellation circuit to optimal values via the adaptation controller. There are many different algorithms available for adjusting the CGAs in the feedforward circuit, but the complexity and rate of convergence vary significantly depending on what signals are monitored in the circuit. For example, an adaptation controller 714, as shown in FIG. 7, monitors only the output error signals ($v_e$ and $v_o$) for the signal and distortion cancellation circuits to generate control signals a and b. Known optimization algorithms, such as the Nelder-Mead (NM) simplex algorithm, the Davidon-Fletcher-Powell (DFP) algorithm, or those set forth in U.S. Pat. No. 5,489,875, operate to minimize the power in the associated error signal, but they are slow to converge. For example, in the DFP algorithm, the first derivatives of the signal cancellation circuit function are estimated with perturbations. Perturbations are deliberate misadjustment of the CGAs and used to estimate the local gradient of the circuit, but the perturbations add jitter to the output error signal and are numerically intensive. The number of misadjustments to calculate each update in the algorithm grows rapidly as the number of branches in the complex gain adjuster grows. For such reasons, adaptation methods that monitor only the error signal ($v_e$ or $v_o$) are slow to converge.

Substantially faster convergence can be obtained by monitoring additional signals in the circuit and employing algorithms that compute correlations among them and the error signals. An example of such correlation-based algorithms is least mean squared (LMS) as described in U.S. Pat. No. 5,489,875. Faster convergence is obtained in the case of multibranch adjusters by correlation-based algorithms like decorrelated LMS (DLMS), least squares (LS) and recursive LS (RLS). (The mention of the DLMS, LS and RLS algorithms in this Background Section is not intended to imply that they are prior art to the present invention.)

FIG. 8 shows an example of a multibranch feedforward circuit where internal branch signals labelled as $v_{am}$ and $v_{bm}$ are monitored by adaptation controller 814 as well as the error signals $v_e$ and $v_o$ to generate control signals a and b. The internal signals correspond to the signals in the adjuster circuits, similar to $v_{a1}$ through $v_{aM}$ shown in FIG. 2 or $v_{b1}$ through $v_{bN}$ shown in FIG. 6. In FIG. 8, a stroke through the monitor lines $v_{am}$ and $v_{bm}$ from adjuster circuits s and d means that a group of M or N signals are monitored respectively. An example of a prior art feedforward linearizer with branch monitors can be found in U.S. Pat. No. 5,489,875.

The branch monitor is a narrowband receiver that selectively samples a portion of the input power spectrum. The receiver is agile and, by programming different local oscillator frequencies, different portions of the power spectrum are selectively sampled. FIG. 9 shows an example of a monitor receiver block diagram. The monitor is frequency selective and the frequency ($f_i$) sampled by the analog to digital converter (ADC) depends on the local oscillator frequencies $f_{LO1}$ and $f_{LO2}$. The frequency selectivity of the monitor branches is explicitly noted by including the variable $f_i$ in signal names. The input to the branch monitor receiver is first amplified by low noise amplifier 901, and is then down-converted by down converters 902 and 903, although more or fewer stages of downconversion may be appropriate, depending on the application. The down-converted signal is then digitized by the ADC 904 to generate $v_{amj}(f_1)$. Down converter 902 (903) include mixer 910 (920) having a mixing signal generated by local oscillator frequency 913 (923) at frequency $f_{LO1}$ ($f_{LO2}$). The output of the mixer 910 (920) is bandpass filtered by bandpass filter 911 (921) followed by amplifier 912 (922).

Branch monitor receivers can be used together to form partial correlations over a portion of the input power spectrum. FIG. 10 shows a partial correlator, in which local oscillators 1001 and 1002 select the frequency of the partial correlation. Frequency shifting and bandpass limitation are performed by the mixer/bandpass filter combinations 1003/1007, 1004/1008, 1005/1009, and 1006/1010. The signals output by the bandpass filters 1009 and 1010 are digitally converted, respectively, by analog-to-digital converters (ADCs) 1011 and 1012. Those digital signals are bandpass correlated by digital signal processor (DSP) 1013 to produce the real and imaginary components of the partial correlation. (See, for example, FIG. 9 of U.S. Pat. No. 5,489,875 for a description of the operation of a partial correlator similar to that shown in FIG. 10 herein.)

Although correlation-based algorithms are well suited to adapting multibranch feedforward circuits, one of their drawbacks is the requirement of a separate branch monitor to sample each of the M and N internal adjuster signals, as well as the error signal, in contrast to the less efficient power minimization algorithms which require only an error signal monitor. That is, a branch monitor is required for each of the M and N branches in the adjuster circuits.

Accordingly, there is a need for a reduced architecture which requires only a single monitor receiver for each of the signal cancellation and distortion cancellation circuits, irrespective of the number of branches in each of those circuits. Such a reduced architecture would result in a significant savings in cost, because, as noted above, branch monitors contain many components.

SUMMARY OF THE INVENTION

In one aspect of the present invention, an amplifier linearizer circuit has a signal cancellation circuit including a signal adjuster having M branch signals (M≧1), and a distortion cancellation circuit including a signal adjuster having N branch signals (N≧1). The linearizer has a controller for adaptively controlling the M-branch and N-branch signal adjusters. The controller has only one monitor receiver to monitor the M branch signals and only one monitor receiver to monitor the N branch signals.

This and other aspects of the present invention may be ascertained from the detailed description of the preferred embodiments set forth below, taken in conjunction with one or more of the following drawings.

DETAILED DESCRIPTION OF THE PREFERRED EMBODIMENTS

Figure 11:
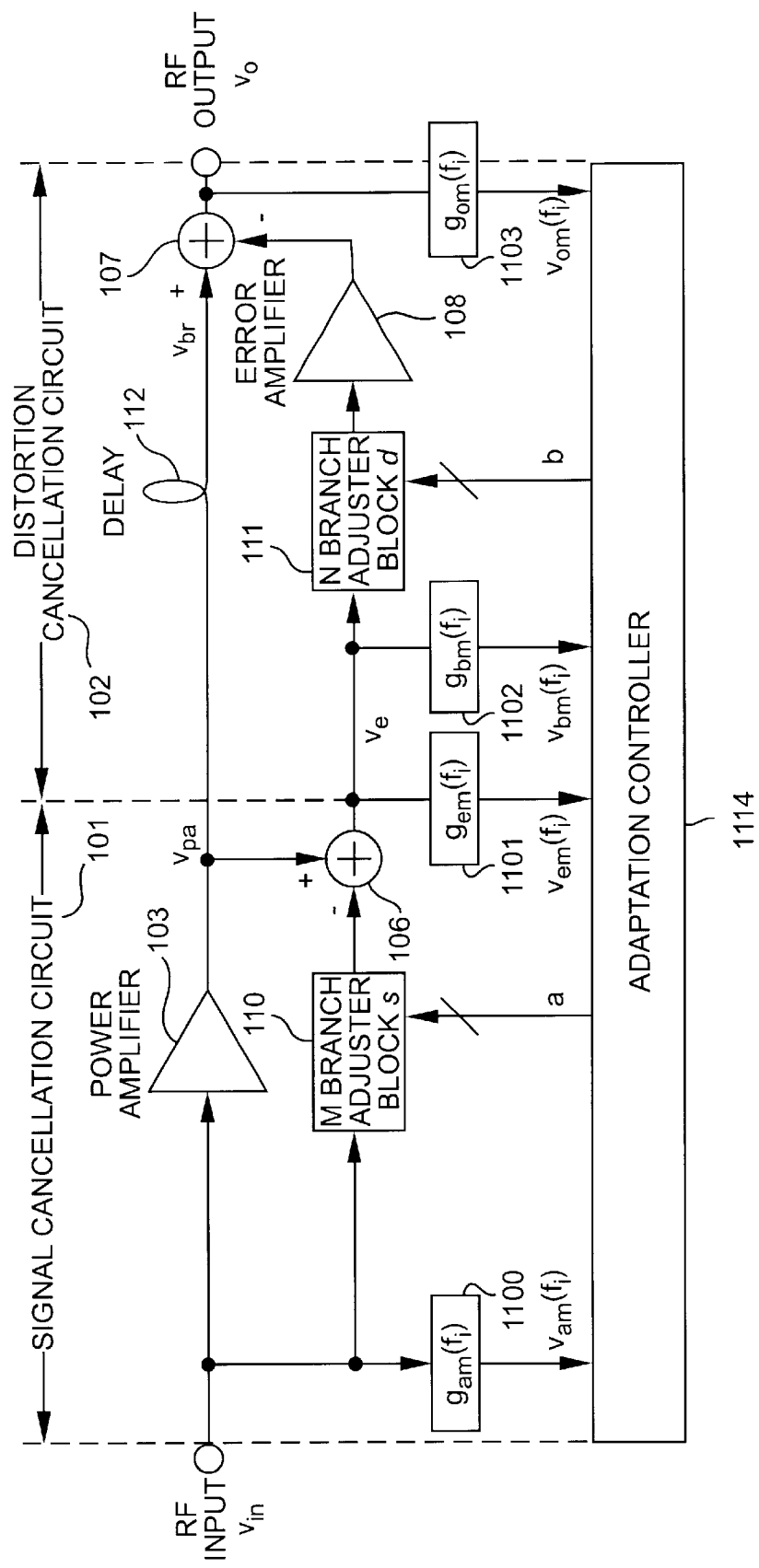
FIG. 11 is a block diagram of a multibranch feedforward linearization circuit adapted by monitoring two error signals: $v_{em}(f_1)$ and $v_{om}(f_i)$, and two monitor signals $v_{am}(f_i)$ and $v_{bm}(f_i)$. The circuit has four frequency selective monitoring receivers described by complex gain functions $g_{am}(f_i)$, $g_{em}$ ($f_1$), $g_{bm}(f_1)$ and $g_{om}(f_1)$. The frequency $f_1$ refers to the subband selected by the monitor receivers.

The present invention provides a reduced architecture for adaptive multibranch feedforward linearizers. FIG. 11 shows a multibranch feedforward circuit configuration with a single branch monitor in each of the signal and distortion cancellation circuits. The M/N multibranch circuit is adapted by adaptation controller 1114 using four monitor receivers modelled by the complex gain functions $g_{am}(f_1)$ (1100), $g_{em}(f_1)$ (1101), $g_{bm}(f_i)$ (1102) and $g_{om}(f_1)$ (1103). The four monitor branches enable simultaneous adaptation of both the distortion and signal cancellation circuits.

The invention achieves this hardware reduction by synthesizing the M/N internal branch signals in the adjuster circuits from a single monitor receiver by using a combination of data from prior calibration measurements and F partial correlations made at F distinct (uncorrelated) frequencies where F is greater than or equal to M (or N for the distortion cancellation circuit).

Figure 12:
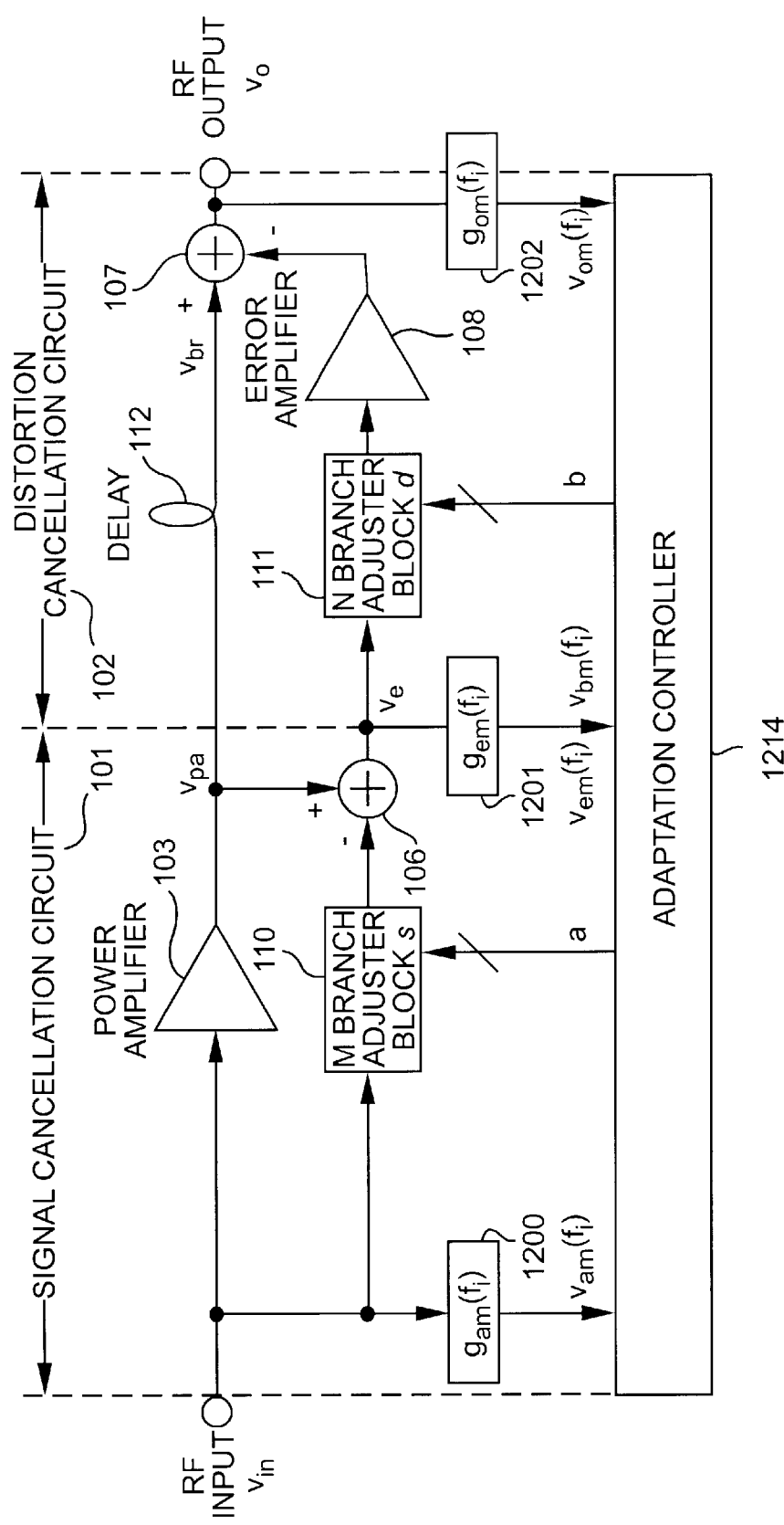
FIG. 12 is a block diagram of a multibranch feedforward linearization circuit adapted by monitoring two error signals: $v_{em}(f_1)$ and $v_{om}(f_i)$, and two banks of monitor signals $v_{am}(f_i)$ and $v_{bm}(f_i)$. The circuit has three frequency selective monitoring receivers described by complex gain functions $g_{am}$ ($f_i$), $g_{em}(f_1)$ and $g_{om}(f_i)$. The monitor receiver $g_{em}(f_1)$ is employed jointly in the signal and distortion cancellation circuits to alternatively monitor $v_{em}(f_1)$ and $v_{bm}(f_1)$. The frequency $f_1$ refers to the subband selected by the monitor receivers.

A further reduction in monitoring hardware is obtained if the signal and distortion cancellation circuits are adapted alternately. Since the monitor signals, $v_{em}(f_1)$ and $v_{bm}$ ($f_1$), are measured from the same signal $v_e$ as shown in FIG. 11, the monitor receiver $g_{em}(f_i)$ 1101 could be used for both the signal and distortion cancellation circuits. The hardware monitoring for the multibranch circuit in FIG. 11 is therefore reduced to three branch monitor receivers as shown in FIG. 12. Three monitor receivers, $g_{am}(f_i)$ (1200), $g_{em}(f_1)$ (1201) and $g_{om}(f_i)$ (1202), are used by adaptation controller 1214 to adapt both the signal and distortion cancellation circuit, where the monitor receiver $g_{em}(f_i)$ 1201 is shared alternately between the distortion and signal cancellation circuits.

Figure 13:
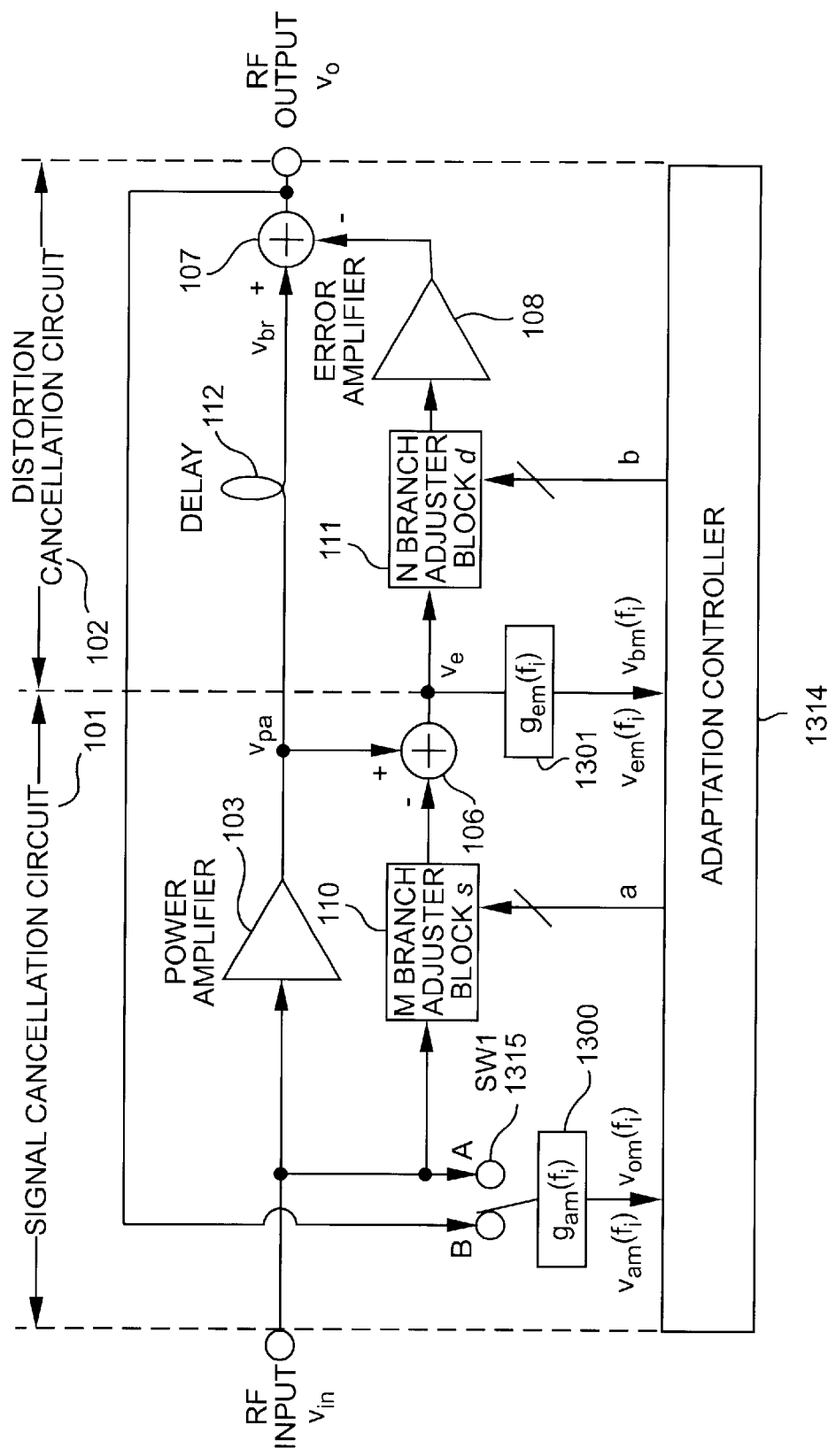
FIG. 13 is a block diagram of a multibranch feedforward linearization circuit adapted by monitoring two error signals: $v_{em}(f_1)$ and $v_{om}(f_1)$, and two monitor signals $v_{am}(f_1)$ and $v_{bm}(f_1)$. The circuit has two frequency selective monitoring receivers described by complex gain functions $g_{am}(f_i)$ and $g_{em}(f_1)$. The controller alternately selects between $v_{am}(f_1)$ and $v_{om}(f_1)$ via switch SW1 under control of the adaptation controller. The monitor receiver $g_{em}(f_1)$ is employed jointly in the signal and distortion cancellation circuits to alternatively monitor $v_{em}(f_1)$ and $v_{bm}(f_1)$ via the adaptation controller. The frequency $f_1$ refers to the subband selected by the monitor receivers.

The hardware monitoring can be reduced further still to two monitor receivers if the input signals to the monitor receivers are switched between the signal and distortion cancellation circuits. FIG. 13 shows a multibranch linearizer with two branch monitor receivers, $g_{am}(f_1)$ 1300 and $g_{em}(f_1)$ 1301, where the adaptation controller 1314 controls the switch SW1 (1315). In the two monitor receiver configuration, the signal cancellation circuit is adapted when SW1 1315 is in position A with $g_{am}(f_1)$ 1300 monitoring the branch signals and $g_{em}(f_1)$ 1301 monitoring the error signal.

When the switch SW1 1315 is in position B, the distortion cancellation circuit is adapted and $g_{em}(f_1)$ 1301 monitors the branch signals while $g_{am}(f_1)$ 1300 monitors the error signal. The feedforward circuits in FIGS. 11 and 12 with three or four branch monitoring receivers may be preferred if isolation problems in SW1 1315 limit the level of distortion cancellation in the circuit.

Figure 14:
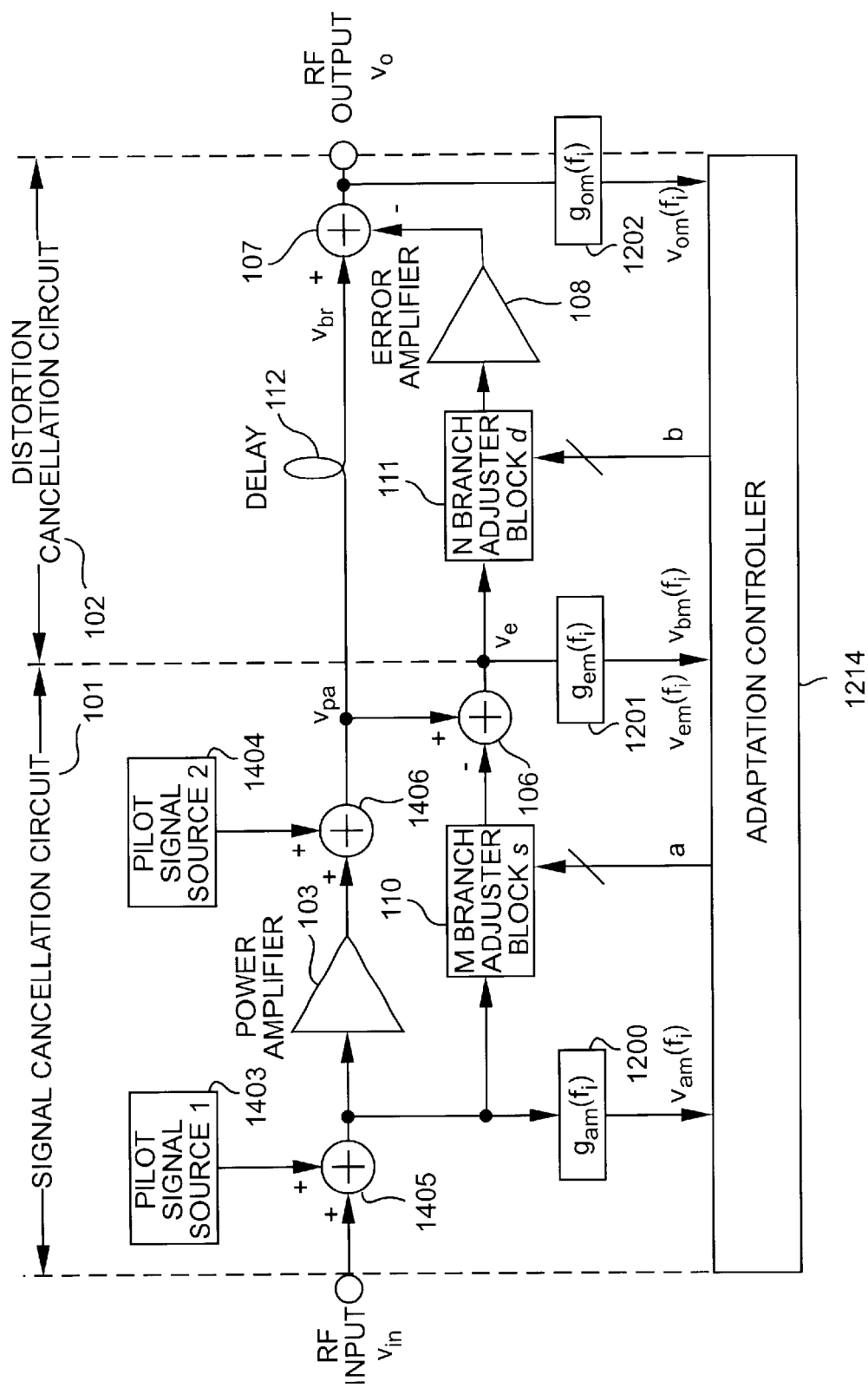
FIG. 14 is a block diagram of a multibranch feedforward linearization circuit adapted/calibrated with pilot signals. The agile pilot signal source 1 is for signal cancellation adaptation and agile pilot signal source 2 is for distortion cancellation adaptation.

This invention further includes linearizers with agile pilot signal generators in the signal and/or distortion cancellation circuits. Single branch feedforward circuits that employ pilot signal generators to provide reference signals for adaptation are known in the art. Typically, they use a single tone for each of the signal cancellation and distortion cancellation circuits, with the tones placed in frequency to avoid interference with desired signals. However, the prior art fails to disclose the use of multiple pilot tones in several frequency locations for self-calibration, or to guide adaptation of a multibranch feedforward linearizer so that it can place frequency response nulls at those frequency locations. Accordingly, pilot generators may be optionally used in the present invention, for example, for adapting broadband signals with large gaps in the frequency spectrum. FIG. 14 shows an example of a multibranch linearizer with pilot signal generators 1403 and 1404 in the signal and distortion cancellation circuits 101 and 102 respectively. The pilot signals are respectively summed with the input and the output signals of the power amplifier 103 by combiners 1405 and 1406.

The methods in this invention are applicable to multibranch feedforward linearizers which are adapted with algorithms requiring branch and error signal monitoring. Examples of these algorithms include LS, LMS, DLMS, and RLS, and they all require internal adjuster signal monitoring as well as error signal monitoring to adapt the CGAs in a multibranch feedforward linearizer. In general, these adaptation algorithms rely on cross correlations between the internal adjuster signals and the error signal, and for some decorrelating algorithms, cross correlations between internal adjuster signals are also required. For example, the LMS algorithm requires a vector of cross correlations formed by the internal adjusters signals ($v_{aj}$ or $v_{bj}$) and the error signal ($v_e$ or $v_o$). DLMS and RLS also require auto and cross correlation measurements of the internal adjuster signals as well as cross correlations between the internal adjuster signals and the error signal. This invention provides a method of estimating the signal correlations required by algorithms such as LS, LMS, DLMS and RLS by combining F partial correlations made with a single internal signal monitor branch and a single error monitor branch. The F partial correlations are combined with calibration data stored in the adaptation controller to synthesize all the internal adjuster signals from a single branch monitor signal.

Figure 15:
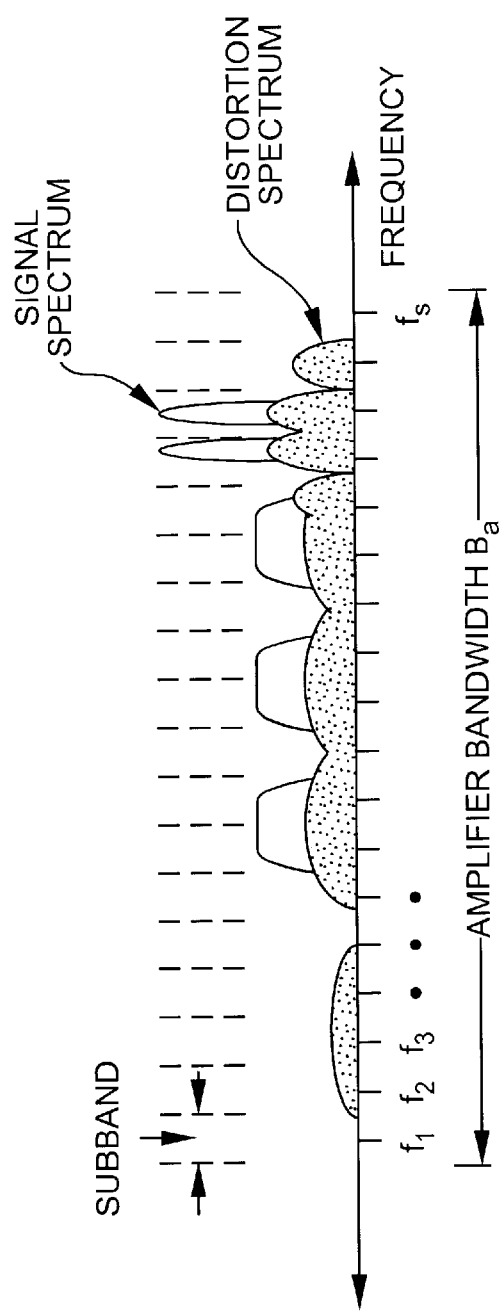
FIG. 15 shows an example of a distorted output power spectrum from a nonlinear amplifier which is partitioned into narrow subbands. The subbands are narrow enough to selectively filter the power spectrum and distinguish between distortion and signal spectra. Although the illustrated spectrum is partitioned into equispaced subbands, equispaced subbands are not generally required for calibration and adaptation.

An important aspect of this invention relates to the frequency selectivity of the hardware monitor branches. The selectivity of the monitor receivers enables the input and output power spectrum of the amplifier to be sampled in narrow frequency blocks called subbands. FIG. 15 shows an example of a typical input and output power spectrum from a nonlinear power amplifier and the spectra are partitioned into narrow frequency intervals called subbands. The subband bandwidth corresponds to the bandwidth of the monitor receiver, and the bandwidth of the amplifier $B_a$ is subdivided into subbands that may or may not be equispaced across the amplifier bandwidth.

Since the monitor receivers are linear narrowband receivers, the frequency response is modelled as a fixed complex gain which depends on a specific subband frequency, $f_1$. As described above, the monitor receivers 1100–1103 in the multibranch feedforward circuit shown in FIG. 11 are respectively identified by the complex functions $g_{am}(f_1)$, $g_{em}(f_1)$, $g_{bm}(f_i)$ and $g_{om}(f_i)$. Through a calibration process described next, the complex gain characteristics of the monitor branches are characterized to determine the relationship between internal adjuster signals and monitor signals. By combining calibration with a sum of independent partial correlations made at F different subband frequencies, estimates of the correlations required by adaptation algorithms are synthesized. The method is first described in terms of the signal cancellation circuit with adjuster circuit s in parallel with the power amplifier, and the extensions to adjuster circuit s in series with the power amplifier and adjuster circuit d are described subsequently.

Figure 16:
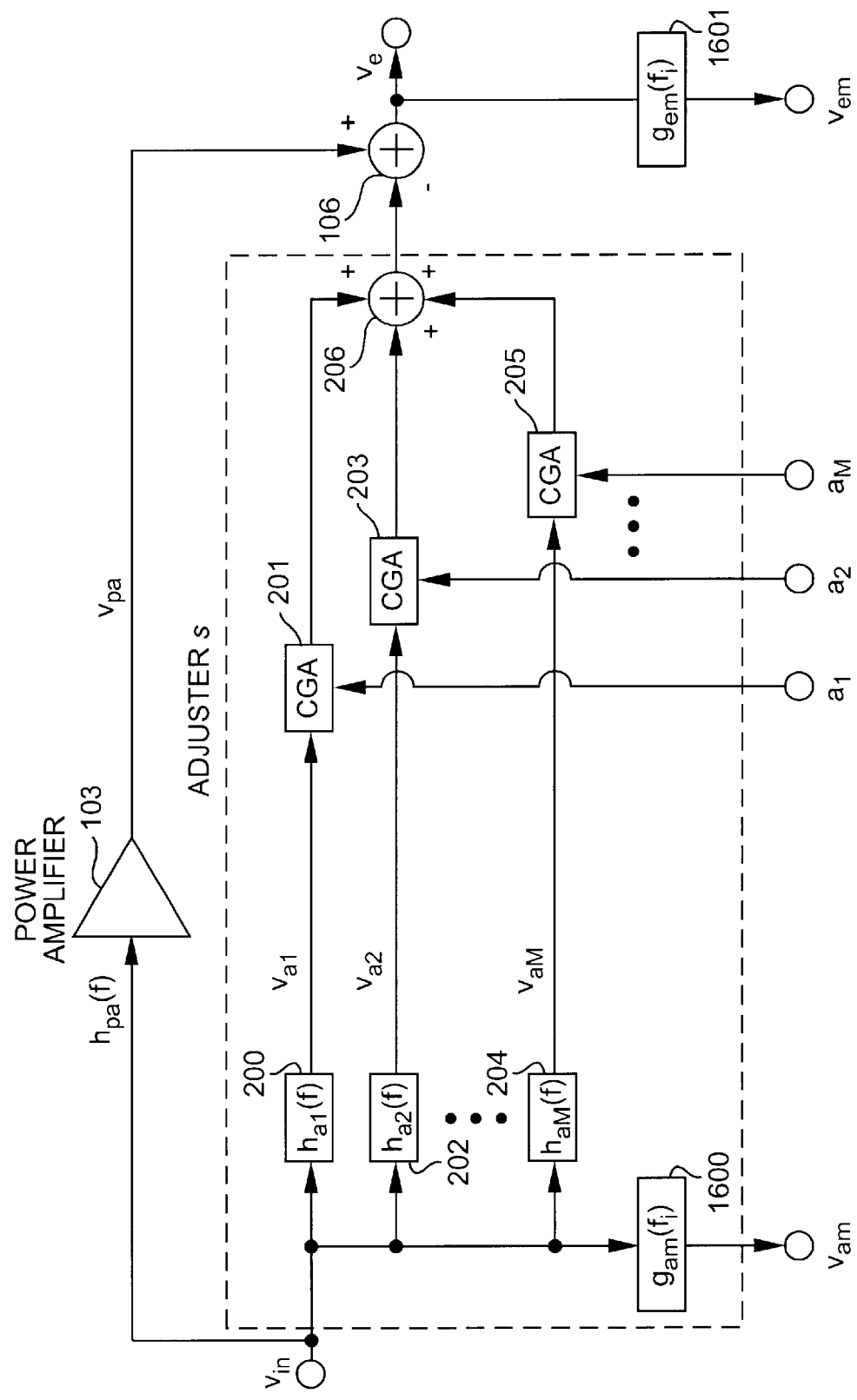
FIG. 16 shows a model of a multibranch feedforward signal cancellation circuit with adjuster circuit s in parallel with a power amplifier. Two monitor branches are shown and modelled by complex gain functions $g_{am}(f_i)$ and $g_{em}(f_1)$.
Figure 17:
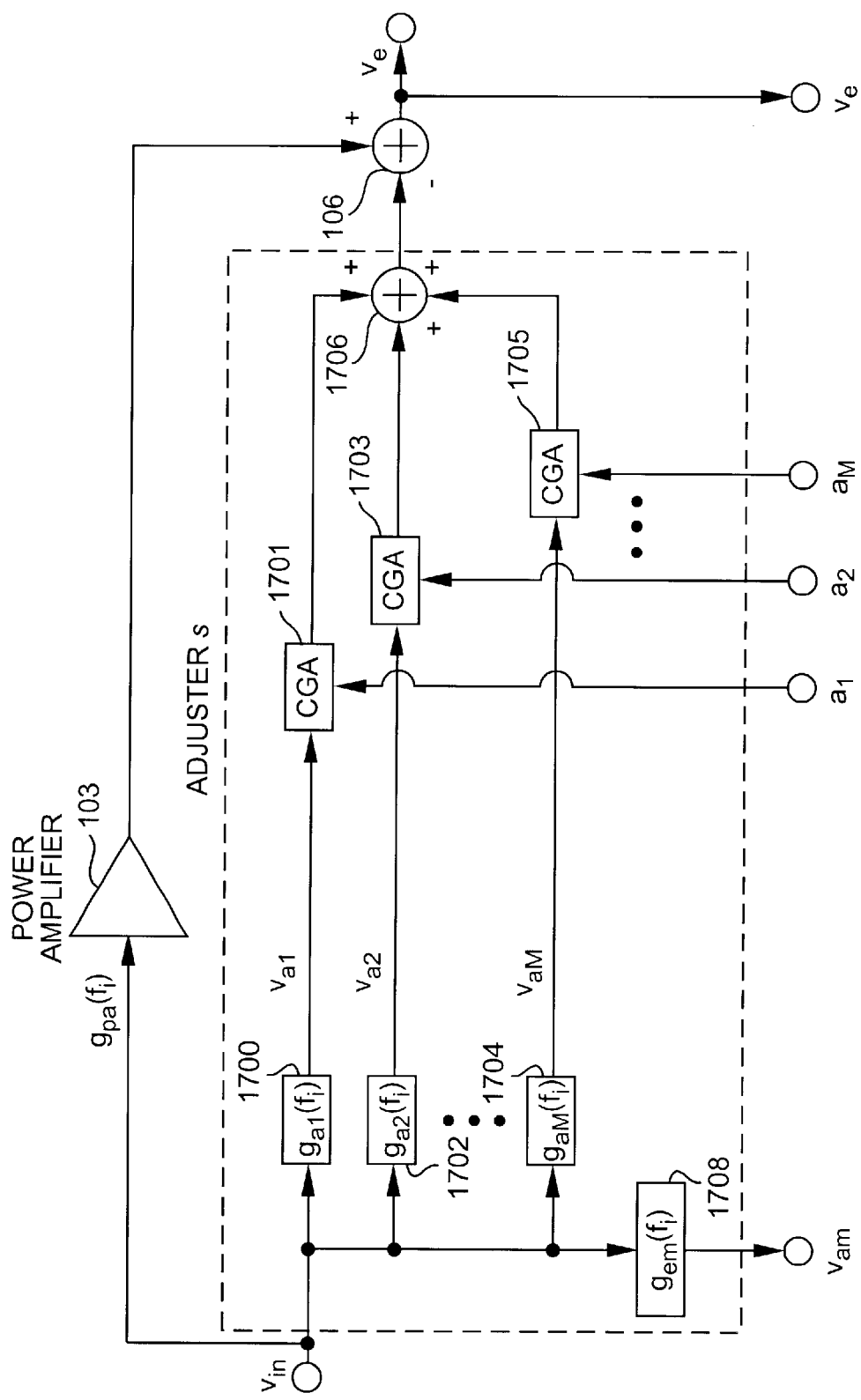
FIG. 17 shows a model of a multibranch feedforward signal cancellation circuit with adjuster circuit s in parallel with a power amplifier. The error branch monitor receiver modelled by $g_{em}(f_i)$ (see FIG. 16) is absorbed into the cancellation circuit branch paths $g_{a1}(f_1)$ through $g_{aM}(f_1)$ and the amplifier branch $g_{pa}(f_i)$.

FIG. 16 shows the signal cancellation circuit with an M branch adjuster in parallel with the power amplifier. Each branch contains a filter (200, 202, 204) and a CGA (201, 203, 205), the outputs of which are summed by combiner 206. The internal branch monitor receiver is modelled by $g_{am}(f_1)$ 1600, and the error branch monitor receiver modelled by $g_{em}(f_1)$ 1601. The circuit model in FIG. 16 is transformed into the circuit model shown in FIG. 17 by absorbing the error monitor complex gain function $g_{em}(f_1)$ 1601 into the individual circuit branches. The new circuit branches are modelled by the functions $g_{aj}(f_i)$ where j=1 to M (1700, 1702, 1704) and $g_{pa}(f_1)$ for the power amplifier 103 branch. Each branch has a CGA (1701, 1703, 1705), the outputs of which are summed by combiner 1706. The transformed circuit model shows that the frequency response of the error branch monitor receiver $g_{em}(f_i)$ 1708 does not need to be considered explicitly which simplifies the characterization of the circuit.

Figure 6:
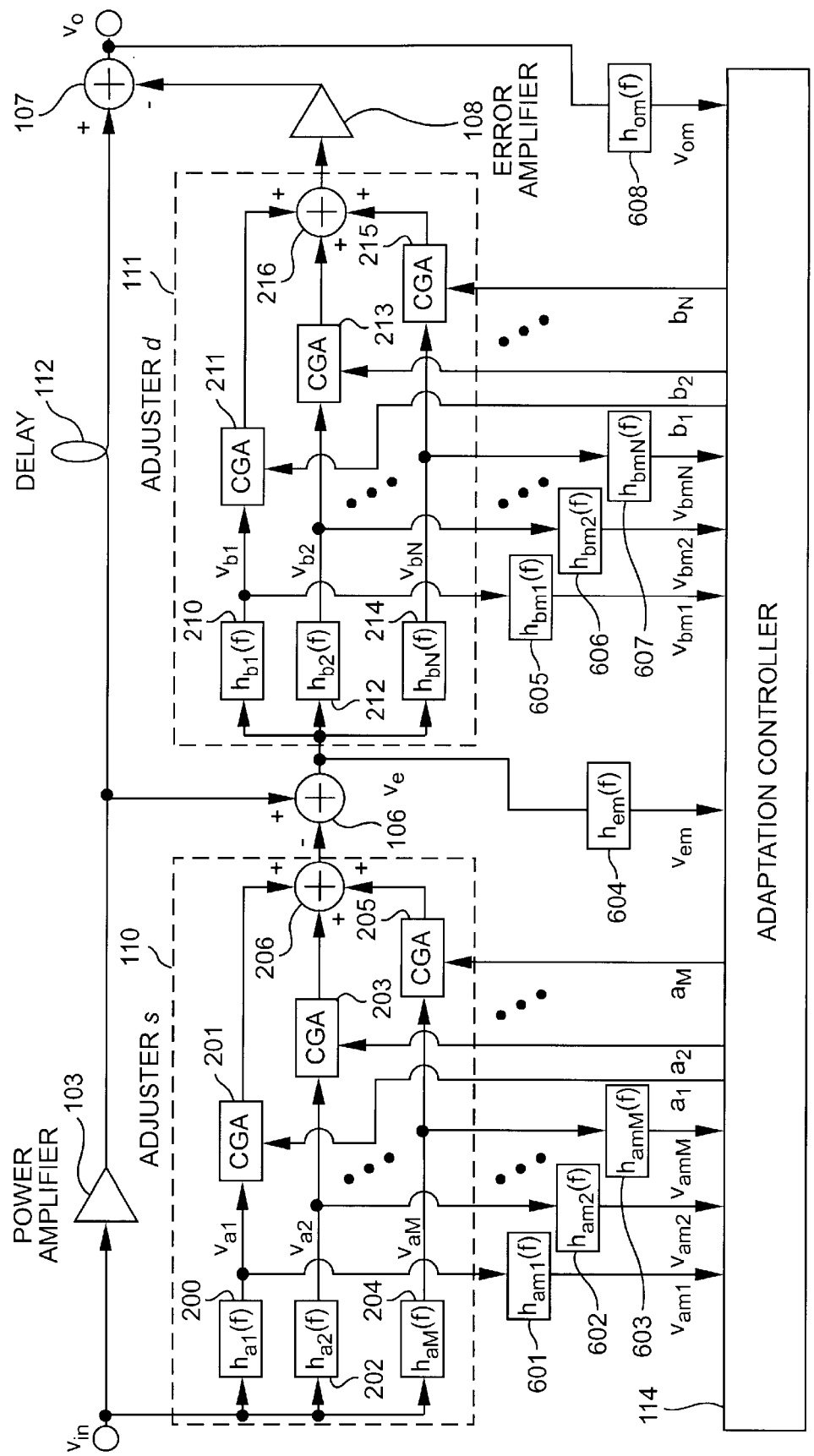
FIG. 6 is a block diagram of a multibranch feedforward linearization circuit with an M-branch adjuster s and an N-branch adjuster d employing an adaptation method in which internal adjuster signals are monitored.
Figure 7:
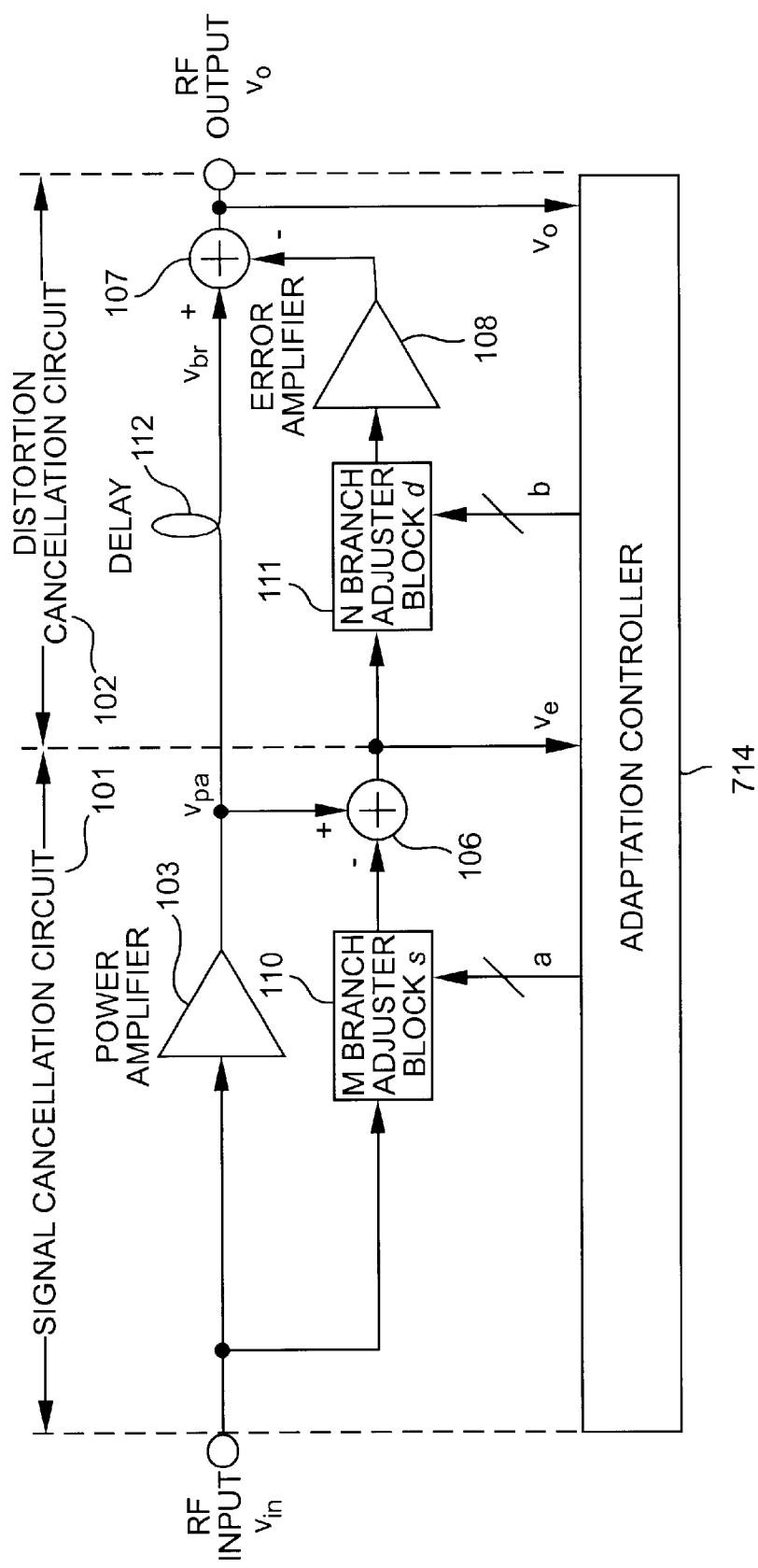
FIG. 7 is a block diagram of a multibranch feedforward linearization circuit adapted by monitoring two error signals: $v_e$ and $v_o$. The adaptation controller uses the error signals to update the CGAs in the adjuster circuits s and d. The control lines for adjuster circuit s are labelled as a and the control lines for adjuster circuit d are labelled as b.
Figure 8:
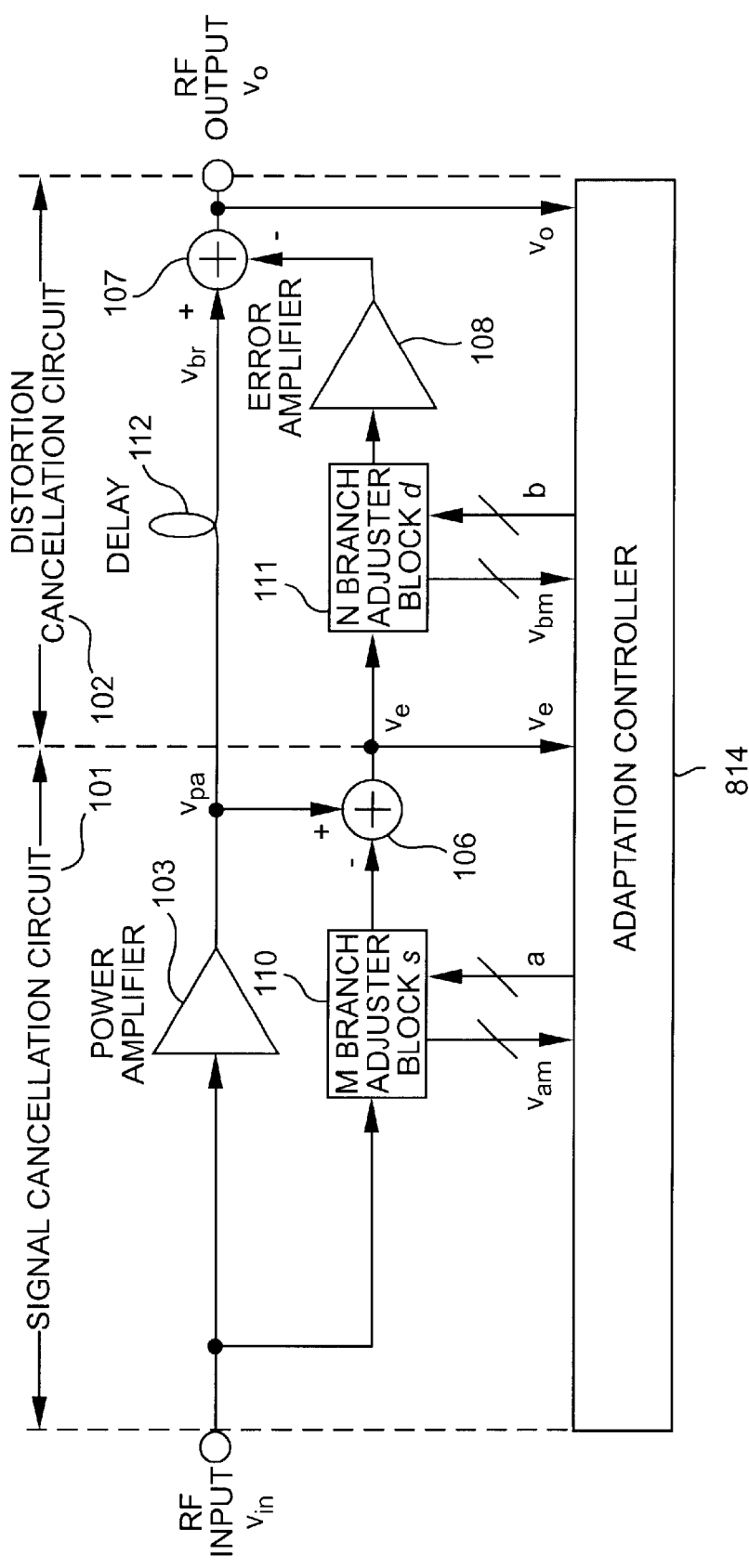
FIG. 8 is a block diagram of a multibranch feedforward linearization circuit adapted by monitoring two error signals: $v_e$ and $v_o$, and two banks of monitor signals $v_{am}$ and $v_{bm}$. The adaptation controller uses all of the monitored signals to update the CGAs in the adjuster circuits s and d. The control lines for adjuster circuit s are labelled as a and the control lines for adjuster circuit d are labelled as b.
Figure 9:
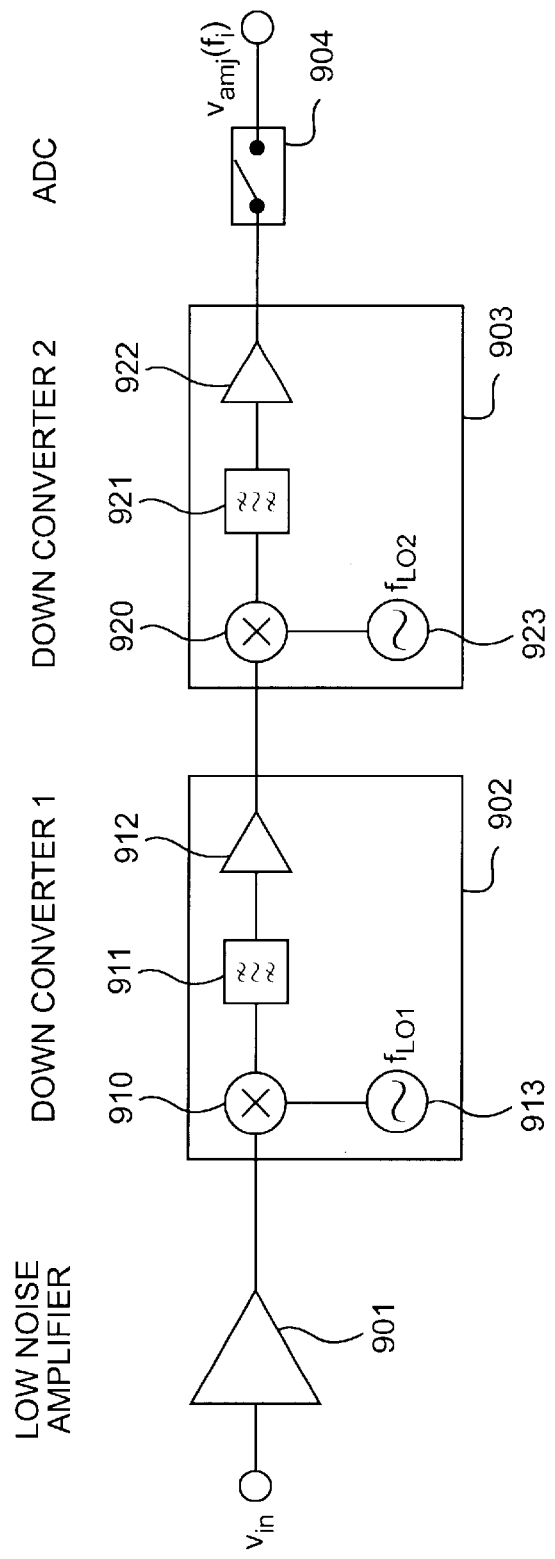
FIG. 9 is a block diagram of a monitor receiver for a multibranch feedforward linearization circuit. The monitor is frequency selective and the frequency ($f_1$) sampled by the analog to digital converter (ADC) depends on the local oscillator frequencies $f_{LO1}$ and $f_{LO2}$.

Notably, the prior art fails to disclose methods for relating the monitored branch signals $v_{am}$ and $v_{bm}$ to the true internal signals in the adjuster circuits. Although the monitor signals are indicated by a line in the figures, a hardware implementation of the branch monitors involves cables or circuit board traces and components such as mixers, filters and amplifiers, as described above. Therefore the signals at the outputs of the branch monitors have an unknown relationship with the internal adjuster signals. For example, as mentioned previously, the frequency response of the monitor branches of FIG. 6 is explicitly denoted by the functions $h_{am1}(f)$ through $h_{amM}(f)$, $h_{b1}(f)$ through $h_{bN}(f)$, $h_{em}(f)$, and $h_{om}(f)$. Unknown relationships between internal adjuster signals and monitor signals can result in slow convergence, or even failure, of the adaptation algorithm.

In the present invention, the calibration constants are calculated with respect to a single branch monitor, and are done with selective frequency sampling by the monitor branches. In particular, the calibration procedure determines the transformation relating a single branch monitor signal at subband frequency $f_1$, $v_{am}(f_1)$, with the branch signals, $v_{a1}(f_1)$ through $v_{aM}(f_1)$. In operation, correlations are made between the output of the single adjuster circuit branch monitor and the output of the error signal monitor. Applying a set of calibration constants allows sufficiently accurate estimation of the corresponding correlations between the M branch signals and the error signal. The latter correlations are employed by adaptation algorithms.

If the subband bandwidth is narrow, the relationship between the signals is approximated by a complex gain constant, $k(f_1)$. The following equations describe the relationship between the monitor branch signal $v_{am}(f_i)$ and the branch signals:

$$v_{a1}(f_i) = v_{am}(f_i) \cdot k_{am1}(f_i)$$
$$v_{a2}(f_i) = v_{am}(f_i) \cdot k_{am2}(f_i)$$
$$\ldots$$
$$v_{aM}(f_i) = v_{am}(f_i) \cdot k_{amM}(f_i)$$
(1-1)

The calibration procedure defined next shows a method to measure and calculate the complex gain constants $k_{amj}(f_1)$ where the index j refers to the jth branch signal and $f_i$ refers to a subband frequency $f_1$. The calibration procedure is an example of one method of finding the calibration constants. Further calibration procedures can be derived based on the various embodiments described in the aforementioned U.S. patent application entitled "Self-Calibrated Power Amplifier Linearizers."

Figure 10:
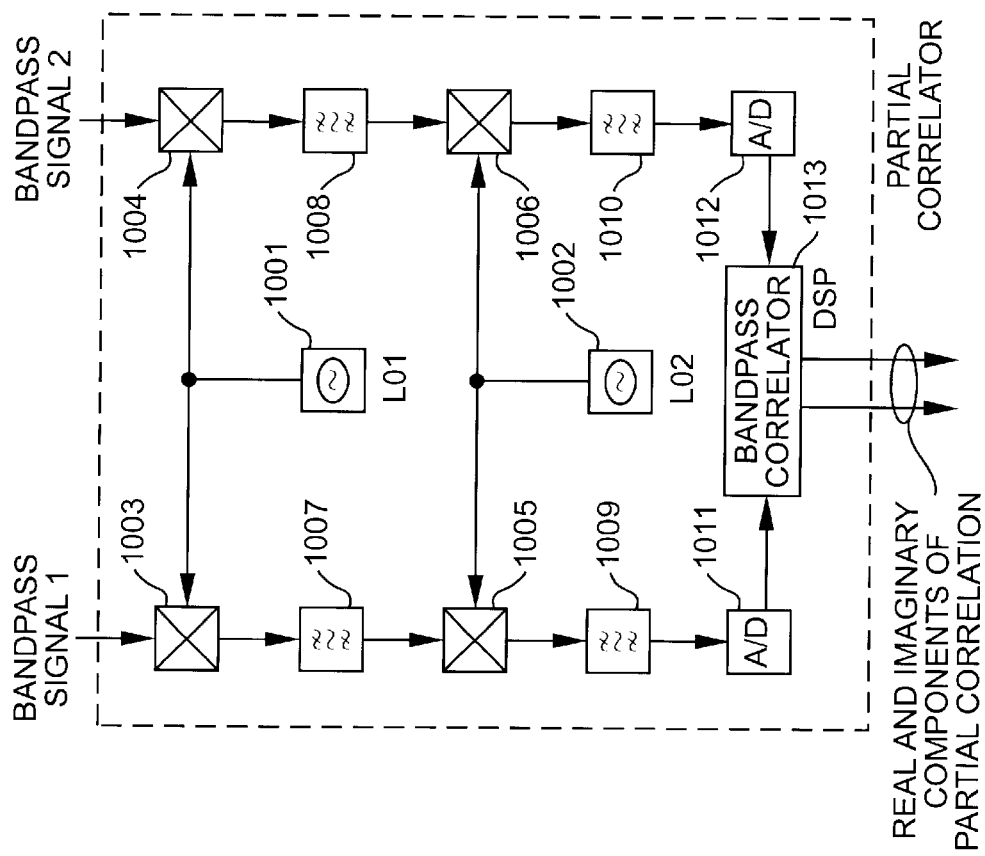
FIG. 10 is a block diagram of a partial bandpass correlator implemented in a digital signal processor (DSP) to avoid DC offset problems.

Calibration procedure to measure $k_{am1}(f_i)$:

1. apply an input signal to the amplifier with a frequency component at $f_1$ or use an internal pilot signal generator (pilot source 1 1403 in FIG. 14) set to frequency $f_1$;
2. set the power amplifier to standby mode so the output signal $v_{pa}$ is zero;
3. set the CGA gains of $a_2$ through $a_m$ to zero by appropriate choice of the control voltages so the corresponding CGA outputs are zero;
4. set the CGA gain $a_1$ to some nominal value $a_1'$ through appropriate choice of control voltages;
5. use a partial correlator (FIG. 10), with local oscillators set to select frequency $f_1$, to produce the correlation of signal $v_e(f_1)$ with monitor signal $v_{am}(f_1)$; the result is $C_{eam1}(f_1)=a_1 \cdot g^*_{am}(f_1) \cdot g_{a1}(f_1) \cdot P_{in}(f_1)$, where $P_{in}(f_1)$ denotes the power of signal $v_{in}(f_1)$ at frequency $f_1$ and the '*' denotes complex conjugation;
6. use a partial correlator, with local oscillators set to select frequency $f_1$, to produce the correlation of monitor signal $v_{am1}(f_1)$ with itself; the result is $C_{am}(f_1) = g_{am}(f_1) \cdot g^*_{am}(f_1) \cdot P_m(f_1)$
7. determine the calibration constant $k_{am1}(f_1)$ as the ratio:

$$\frac{C_{eam1}(f_i)}{a_1' \cdot C_{am}(f_i)};$$

8. store the calibration constant $k_{am1}(f_i)$ in nonvolatile storage in the adaptation controller.

The calibration constants $k_{amj}(f_1)$ for j=2 to M are measured in a similar manner by isolating the jth branch and measuring the correlations $C_{eamj}(f_1)$ and $C_{am}(f_1)$. In general, the jth branch is isolated by setting all other branches open with appropriate control voltages to the CGAs and turning the power amplifier to standby. The calibration constants are also successively calculated for all the different subbands $f_1$ by changing the input frequency or pilot signal generator frequency. Although the calibration constants are in general desired for all subband frequencies $f_1$, fewer subbands can be measured and additional calibration constants are calculated using interpolation.

Once a table of calibration constants is stored in nonvolatile memory in the adaptation controller, the relationships between the monitor signal $v_{am}(f_1)$ and the branch signals $v_{aj}(f_1)$ are known. Since the calibration constants generate linearly dependent signal estimates for the M branch signals (equation (1-1)), a weighted sum of F (independent) partial correlations is required to synthesize a full rank basis for the signal correlations. In general, F independent partial correlations are summed where F is greater than or equal to the number of circuit branches in the adjuster, M.

Figure 18:
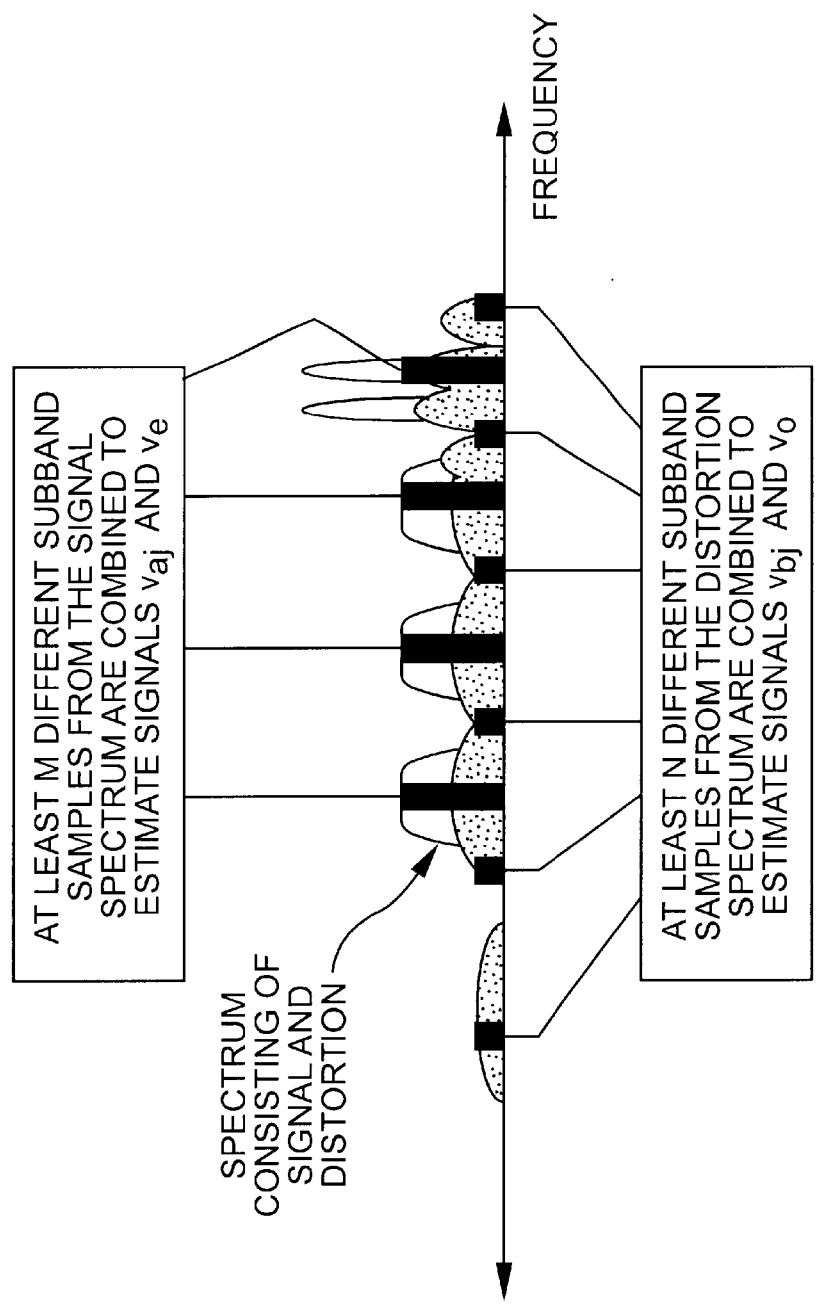
FIG. 18 shows an example of subband sampling to synthesize branch and error signals. At least M subband samples are combined to determine the signals $v_{aj}$ and $v_e$, while at least N subband samples are combined to determine signals $v_{bj}$ and $v_o$.

The F distinct frequencies are selected to sample the signal spectra at different frequencies across the bandwidth of the amplifier signal. For example, if F is equal to 2, then two different subbands are sampled at $f_1$ and $f_2$, where the frequencies are selected to be approximately equispaced across the signal bandwidth. The specific choices of $f_1$ and $f_2$ correspond directly to nulls in the cancellation response of the signal cancellation circuit. FIG. 18 illustrates the selection and sampling of the monitor signals $v_{am}(f_1)$ and $v_e(f_1)$.

Adaptation algorithms are often expressed directly in terms of the internal branch signals $v_{aj}(f_1)$ and the error signal $v_e(f_1)$. For example, the LMS algorithm is often written as:

$$a(n+1)=a(n)+u \cdot v_a(n) \cdot v_e(n)^*$$

where $a(n+1)$ is an updated vector of control voltages applied to the CGAs based on the previous control voltages $a(n)$, the vector of the branch voltages $v_a(n)$, and the complex conjugate of the error voltage $v_e(n)$. However, the LMS algorithm, and similar algorithms such as LS, DLMS and RLS, can also be expressed in terms of correlation rather than voltages. Using the LMS algorithm as an example again, the correlation form of the algorithm is:

$$a(n+1)=a(n)+u \cdot C_{ea}(n)$$

where $C_{ea}(n)$ is a cross correlation vector equal to $v_a(n) \cdot v_e(n)^*$. In general, algorithms require cross correlations between internal branch monitor signals $v_{aj}(f_1)$ and the error signal $v_e(f_1)$, and sometimes cross correlations between different branch signals. The correlation form of these algorithms is exploited, and the methods of this invention show how to synthesize the signal correlations from partial correlations using a single monitor branch signal $v_{am}(f_1)$ and the error signal $v_e(f_i)$.

The correlations required by these algorithms are generically described by the following two functions:

1. $C_{eaj}$: the cross correlation of the branch signal $v_{aj}$ and the error signal $v_e$, where j is an index ranging from 1 to M. For example, LS, LMS, DLMS and RLS algorithms all require the computation of this cross correlation.
2. $C_{apq}$: the cross correlation of the branch signal $v_{ap}$ with $v_{aq}$ where p and q are indices which can range from 1 through M. For example, $C_{a12}$ is the cross correlation of signal $v_{a1}$ and $v_{a2}$ and $C_{a11}$ is the (auto) correlation of signal $v_{a1}$ with itself. LS, DLMS and RLS are examples of algorithms that require this correlation.

The correlations $C_{eaj}$ and $C_{apq}$ are determined by a weighted sum of F partial correlations, where F is the number of subbands sampled to form the correlation estimates.

$$C_{eaj} = \sum_{i=1}^{F} w_i \cdot C_{eaj}(f_i) \quad C_{apq} = \sum_{i=1}^{F} w_i \cdot C_{apq}(f_i)$$
(1-2)

Figure 19:
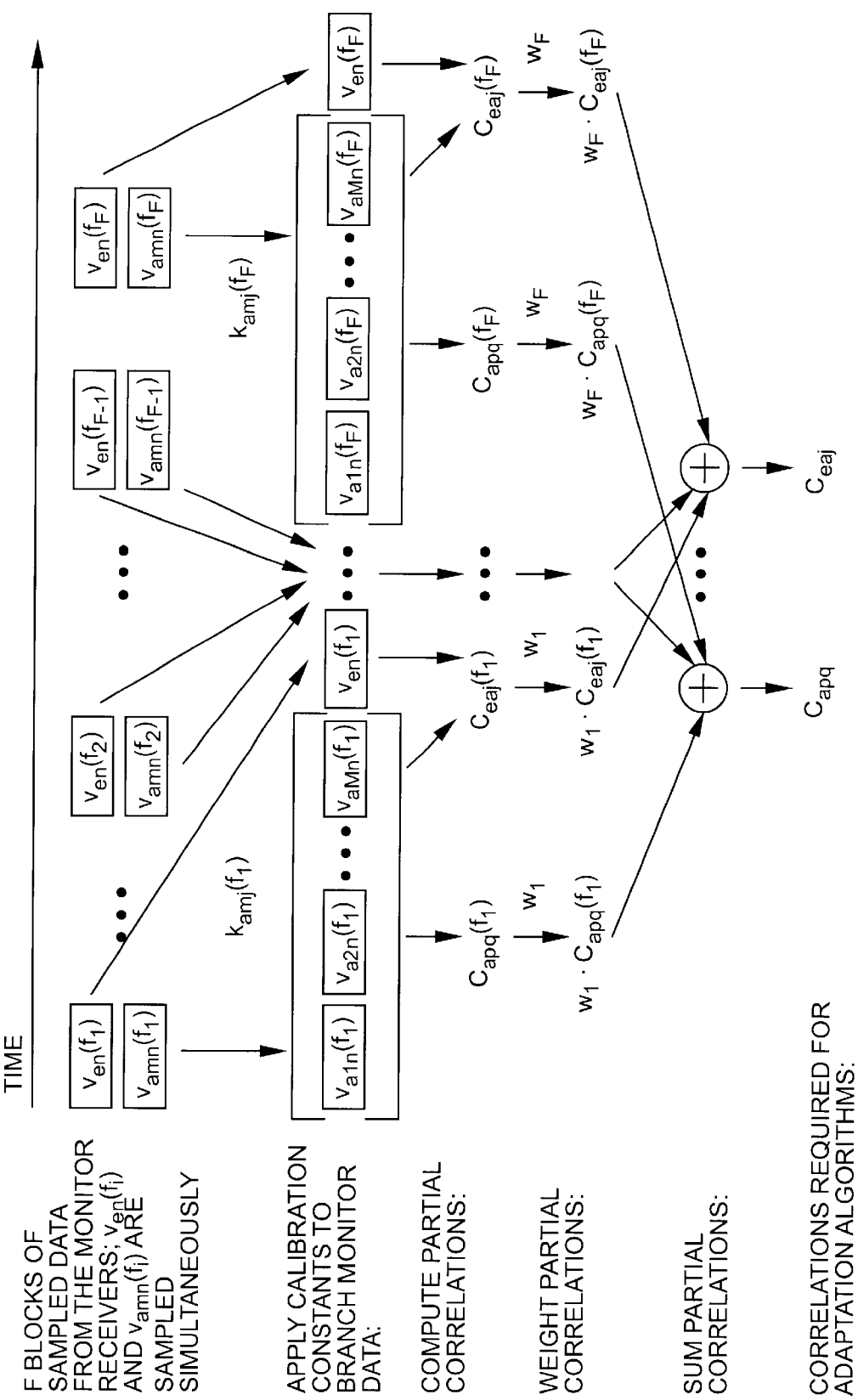
FIG. 19 is a chart showing an adaptation method using two agile monitor receivers to sample an input branch signal and an error signal. Correlations required for algorithms which require internal signal monitoring are generated from F blocks of sampled signals.

The partial correlations at subband $f_1$ are determined from a time average over a block of monitor signal data. The monitor signals $v_{am}(f_1)$ and $v_e(f_1)$ are sampled simultaneously at the output of the monitor receivers; assume a block of $N_s$ samples from each monitor receiver are sampled and stored in the controller memory. F sets of data are sampled at the selected subband as shown in FIG. 19. By employing the calibration data $k_{amj}(f_1)$, the monitor branch signal $v_{am}(f_1)$ is transformed into M arrays of data to synthesize the internal adjuster signals $v_{aj}(f_1)$ (see equation (1–1)).

Let the arrays of synthesized branch signals $v_{aj}(f_i)$ and the array of error signals $v_e(f_i)$ be indexed by the variable n where $v_{ajn}(f_1)$ and $v_{en}(f_1)$ refer to the nth elements of the arrays. The partial correlations are calculated with the arrays of data stored in the adaptation controller memory by calculating a time average over $N_s$ samples.

$$C_{eaj}(f_i) = \frac{1}{N_s} \cdot \sum_{n=1}^{N_s} v_{en}(f_i) \cdot v_{amn}*(f_i) \cdot k_{amj}*(f_i) \quad (1\text{-}3)$$

$$C_{apq}(f_i) = \frac{1}{N_s} \cdot \sum_{n=1}^{N_s} v_{amn}(f_i) \cdot v_{amn}*(f_i) \cdot k_{amp}(f_i) \cdot k_{amq}*(f_i)$$

Together equations (1–2) and (1–3) describe a method of calculating correlations $C_{eaj}$ and $C_{apq}$ from an array of F independently sampled monitor signals $v_{am}(f_1)$ and $v_{em}(f_1)$. The correlations described by these equations can be integrated into any general adaptation method which requires internal adjuster signal monitoring. Note also that the correlations $C_{eaj}$ and $C_{apq}$ may be averaged with their counterpart calculations derived from previously-measured arrays of samples.

The selection of the weighting functions $w_1$ in equation (1–2) depends on the type of cancellation circuit frequency response desired in the signal cancellation circuit. Two weighting schemes are considered here, although other weighting schemes can be developed to customize the frequency response of the cancellation circuit.

1. If a cancellation circuit frequency response is desired which depends directly on the input power spectrum, then an equal weight is assigned to each partial correlation. The weight variable $w_1$ in this case is equal to 1 and the frequency response of the circuit depends on the relative power of the signal spectrum at the selected subbands. An equal weighting scheme may be employed when the power in the selected subbands are relatively equal.
2. If a cancellation frequency response is desired which is independent of the power in the selected subbands, the partial correlations are weighted by a constant proportional to the inverse of the signal power in the corresponding subbands. In this case, each partial correlation is normalized and contributes equally to the weighted sum. With a normalized weighting function, the frequency response of the cancellation circuit is approximately uniform over the bandwidth of the amplifier providing the selected subbands are equispaced over the amplifier bandwidth. This scheme may be preferred when an input spectrum consists of multiple carriers with different modulation formats.

A uniform cancellation response in the signal cancellation circuit (weighting scheme 2) is approximated by selecting subband frequencies equispaced across the bandwidth of the amplifier and uniformly weighting each partial correlation. In other words, the weighting function normalizes the partial correlations by the input power, $P_{in}(f_1)$ at each subband $f_1$:

$$w_i = \frac{1}{P_{in}(f_i)}.$$

The power of the input signal, $P_{in}(f_1)$, is not known directly and is measured indirectly in terms of monitor signals. $P_{in}(f_1)$ is related to the monitor signal $P_{am}(f_1)$ as shown in calibration step 6.

$$P_{am}(f_i) = g_{am}(f_i) \cdot g*_{am}(f_i) \cdot P_{in}(f_i) = |g_{am}(f_i)|^2 \cdot P_{in}(f_i)$$

Note the autocorrelation formerly defined as $C_{am}(f_i)$ is equal to the power of the monitor signal $P_{am}(f_1)$. Since the input power at calibration is known, the constant $|g_{am}(f_1)|^2$ can be stored in nonvolatile memory at the time the calibration constants $k_{amj}(f_1)$ are stored. The weight is written directly in terms of the monitor signal power as:

$$w_i = \frac{|g_{am}(f_i)|^2}{P_{am}(f_i)} \quad (1\text{-}4)$$

Therefore, if a uniform cancellation response is desired, the weight values are obtained directly from calibration in step 6.

A second method for calculating the normalizing weights for weighting scheme 2, is to express the weights in terms of the power amplifier signal power $P_{pa}(f_i)$ instead of the input signal power $P_{in}(f_i)$. Weighting according to the inverse of $P_{pa}(f_i)$ is equivalent to saying that the signal cancellation circuit response is normalized to the output power spectrum of the 'reference' branch in the cancellation circuit. The reason for selecting the power in $P_{pa}(f_1)$ rather than $P_{in}(f_1)$ is the principle generalizes easily to the distortion cancellation circuit as described below.

The relationship between the power amplifier signal $v_{pa}(f_1)$ and the monitor branch signal $v_{am}(f_1)$ is measured by a calibration procedure similar to the procedure described to find the calibration constants $k_{amj}(f_1)$. Let the calibration constant $k_{pam}(f_1)$ relate the signal $v_{pa}(f_i)$ to $v_{am}(f_1)$ as follows:

$$v_{pa}(f_1) = v_{am}(f_1) \cdot k_{pam}(f_1)$$

Once the constant $k_{pam}(f_1)$ is found through a self calibration procedure, the weights are described in terms of the monitor signal power $P_{am}(f_i)$ and the constant $k_{pam}(f_1)$.

$$w_i = \frac{1}{P_{am}(f_i) \cdot |k_{pam}(f_i)|^2} \quad (1\text{-}5)$$

A calibration procedure to measured $k_{pam}(f_1)$ is described below and has a format similar to the measurement of $k_{amj}(f_1)$.

1. apply an input signal to the amplifier with a frequency component at $f_1$; or use an internal pilot signal generator (pilot source 1 1403 in FIG. 14) set to frequency $f_1$,
2. set the power amplifier to ON;
3. set the CGA gains of $a_1$ through $a_M$ to zero by appropriate choice of the control voltages so the corresponding CGA outputs are zero; all signals $v_{aj}(f_1)$ are therefore zero
4. use a partial correlator (FIG. 10), with local oscillators set to select frequency $f_i$, to produce the correlation of signal $v_e(f_1)$ with monitor signal $v_{am}(f_i)$; the result is $C_{eam}(f_1) = g*_{am}(f_1) \cdot g_{pa}(f_i) \cdot P_{in}(f_1)$, where $P_{in}(f_1)$ denotes the power of signal $v_{in}(f_1)$ at frequency $f_i$ and the '*' denotes complex conjugation;
5. use a partial correlator, with local oscillators set to select frequency $f_1$, to produce the correlation of monitor signal $v_{am}(f_1)$ with itself, the result is $C_{am}(f_1) = g_{am}(f_i) \cdot g*_{am}(f_1) \cdot P_{in}(f_1)$;

6. determine the calibration constant $k_{pam}(f_1)$ as the ratio:

$$\frac{C_{eam}(f_i)}{C_{am}(f_i)};$$

7. store the calibration constant $k_{pam}(f_i)$ in nonvolatile storage in the adaptation controller.

If the normalized weighting method is selected, the above procedure could be concatenated with the procedure to measure $k_{amj}(f_1)$.

The extension of this method to the distortion cancellation and a signal cancellation circuit where the adjuster circuit s is in series with the power amplifier is straight forward. As in the signal cancellation circuit just described, the first step is to generate a calibration table to define the relationship between monitor signals and branch signals. Once the calibration table is generated and stored in nonvolatile memory, a weighted sum of F partial correlations is measured to generate the estimates of the required correlations. The procedures are briefly summarized below.

Figure 20:
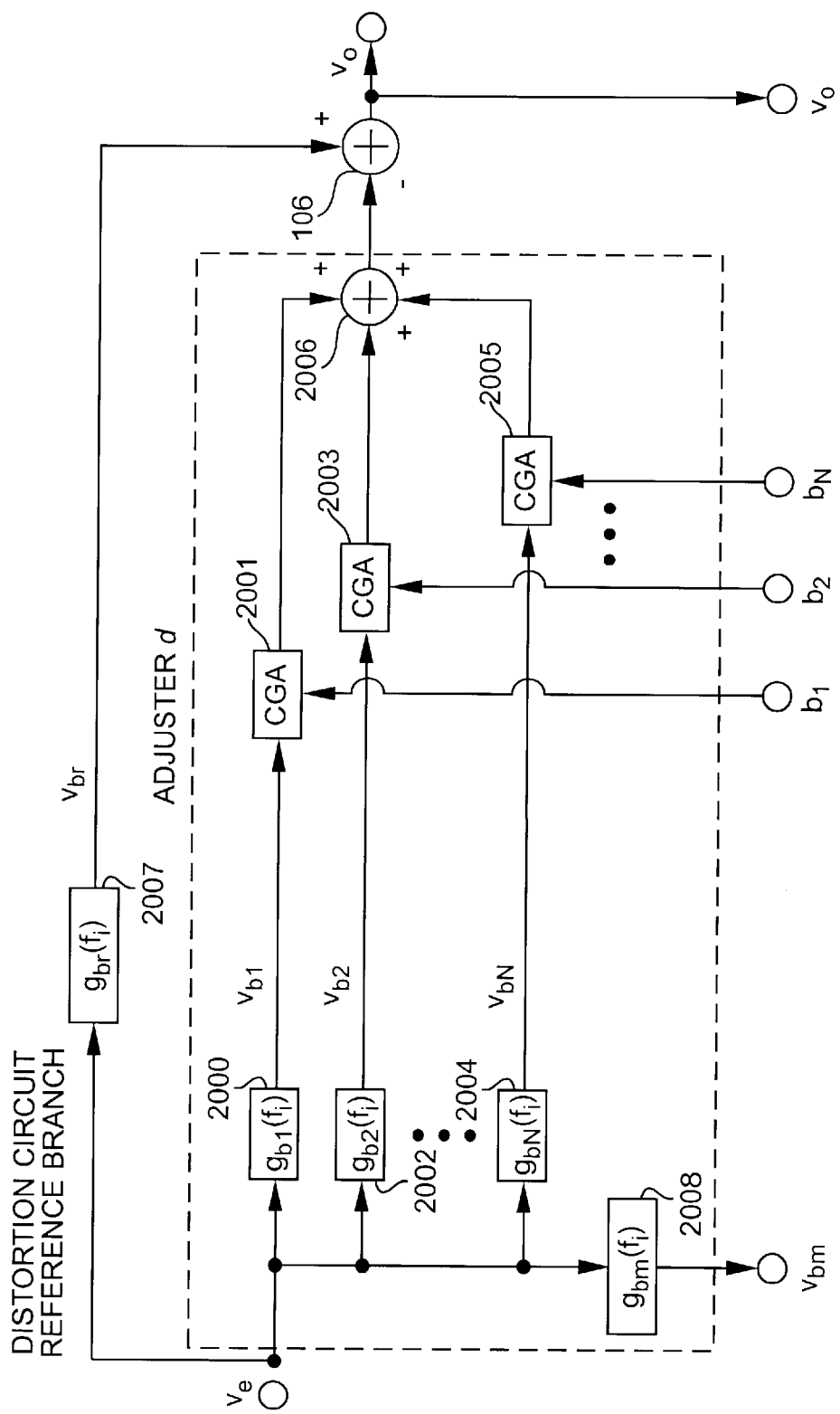
FIG. 20 shows a model of a multibranch feedforward distortion cancellation circuit with an N-branch adjuster circuit d.

A signal model of the distortion cancellation circuit for a N branch adjuster circuit d is shown in FIG. 20. In the model, the error monitor receiver modelled by the complex gain $g_{om}(f_1)$ 1103 in FIG. 11 is absorbed into the reference branch complex gain function $g_{br}(f_1)$ 2007 and the adjuster branch complex gain functions $g_{b1}(f_1)$ 2000, $g_{b2}(f_1)$ 2002, and $g_{bN}(f_1)$ 2004. Also, the error amplifier gain is lumped with the branch complex gain functions $g_{b1}(f_1)$ through $g_{bN}(f_1)$ (2000, 2002, 2004). Each branch has a CGA (2001, 2003, 2005), the outputs of which are summed by combiner 2006. The distortion cancellation circuit is adapted by the monitor signals $v_{bm}(f_i)$ and $v_o(f_1)$. Calibration constants are calculated which enable internal branch signals $v_{bj}(f_1)$ to be synthesized from monitor branch signals $v_{bm}(f_1)$, and correlations $C_{obj}(f_1)$ and $C_{bpq}(f_1)$ are determined by a weighted sum of partial correlation calculated from F partial correlations where F is greater than or equal to N.

The relationship between the internal branch signals in adjuster circuit d and the monitor branch signal $v_{bm}(f_1)$ are related by a calibration constant $k_{bmj}(f_1)$ similar to relationships developed for the signal cancellation circuit.

$$\begin{aligned} v_{b1}(f_i) &= v_{bm}(f_i) \cdot k_{bm1}(f_i) \\ v_{b2}(f_i) &= v_{bm}(f_i) \cdot k_{bm2}(f_i) \\ &\quad \ldots \\ v_{bN}(f_i) &= v_{bm}(f_i) \cdot k_{bmN}(f_i) \end{aligned} \quad (1\text{-}6)$$

The relationship between the monitor signal $v_{bm}(f_1)$ and the distortion cancellation reference signal $v_{br}(f_1)$ is related by the constant $k_{brm}(f_1)$ and may be desired for some weighting schemes.

$$v_{br}(f_1) = v_{bm}(f_1) \cdot k_{brm}(f_1)$$

Figure 1:
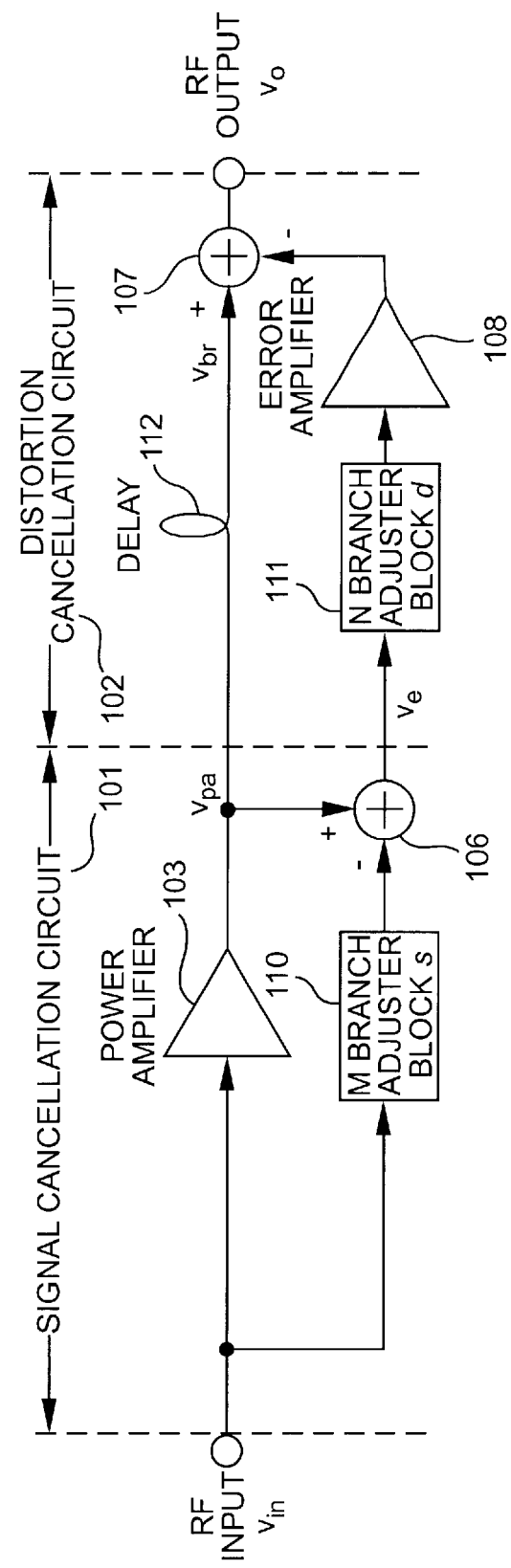
FIG. 1 is a block diagram of a multibranch feedforward linearization circuit with an adjuster circuit s in parallel with a power amplifier. The adjuster circuit s has M parallel circuit branches while adjuster circuit d has N parallel circuit branches.
Figure 2:
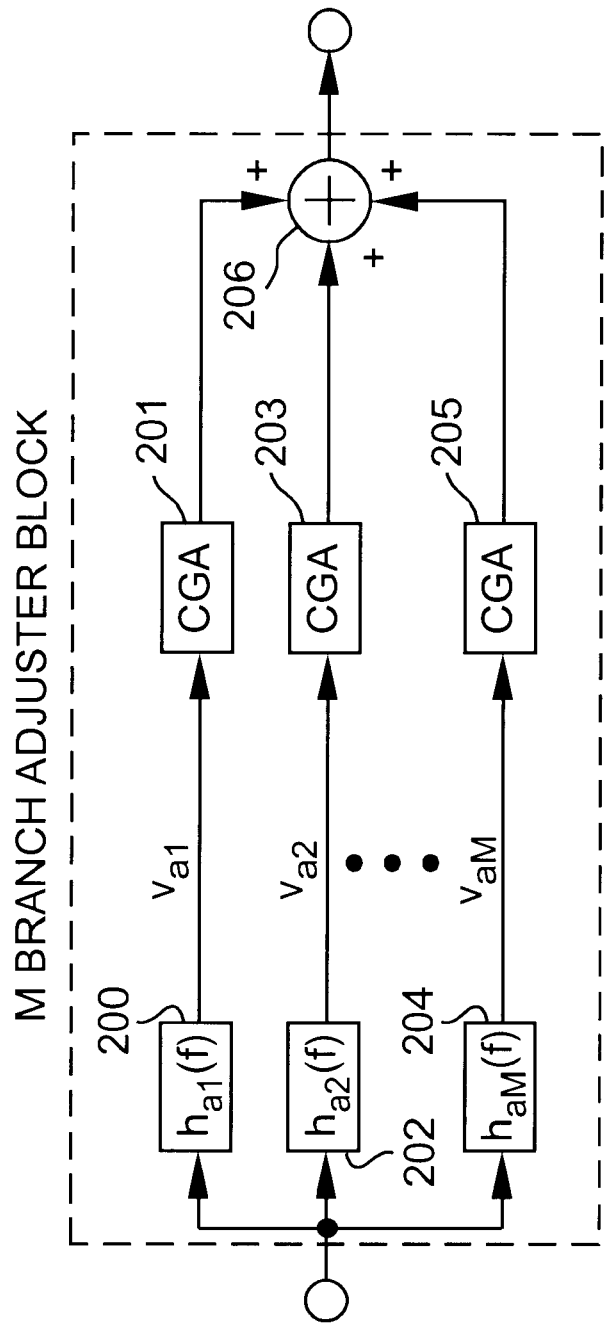
FIG. 2 is a block diagram of an M-branch adjuster circuit.

A calibration procedure is required to calculate the complex gain constants $k_{brm}(f_1)$ and $k_{bmj}(f_1)$ where the index j refers to the jth branch signal and $f_1$ refers to a subband frequency $f_1$. An example of a method to find the calibration constants is shown below. This procedure assumes that adjuster circuit s is in parallel with the power amplifier (see, for example, FIG. 1 or FIG. 11).

Calibration procedure to measure $k_{bm1}(f_1)$ and $k_{brm}(f_1)$:

1. apply an input signal to the amplifier with a frequency component at $f_1$ and set the power amplifier ON so that there is a signal $v_{pa}$, or use an internal pilot signal generator set to frequency $f_1$ (pilot source 1 (1403) in FIG. 14); Note: pilot source 1 (1403) is used for calibration if pilot signal generators are available in the circuit. If a multibranch circuit topology has pilot source 2 (1404), it is used only for adapting the distortion cancellation.

2. set the CGA gains of $a_1$ through $a_M$ to zero by appropriate choice of the control voltages, so that the CGA output is zero; thus, the only signal path through the signal cancellation circuit is through the power amplifier 3. set the CGA gains of $b_1$ through $b_N$ to zero by appropriate choice of the control voltages, so that all the CGAs in the distortion cancellation circuit have no output signals; thus, the only signal path in the distortion cancellation circuit is through the reference branch ($v_{br}$ in FIG. 20)

4. use a partial correlator, with local oscillators set to select frequency $f_i$, to produce the correlation of signal $v_o$ with monitor signal $v_{bm}$; the result is a bias term $C'_{obm}(f_1)$;

5. use a partial correlator, with local oscillators set to select frequency $f_i$, to produce the correlation of monitor signal $v_{bm}(f_1)$ with itself; the result is $C_{bm}(f_1) = g^*_{bm}(f_1) \cdot g_{bm}(f_1) \cdot P_e(f_1)$ 6. calculate the calibration constant $k_{brm}(f_1)$ as ratio:

$$\frac{C'_{obm}(f_i)}{C_{bm}(f_i)}$$

7. set the CGA gain $b_1$ to some nominal value $b_1'$ through appropriate choice of control voltages;

8. use a partial correlator, with local oscillators set to select frequency $f_i$, to produce the correlation of signal $v_o$ with monitor signal $v_{bm}$; the result is $C_{obm1}(f_1) = b_1' \cdot g_{b1}(f_1) \cdot g^*_{bm}(f_1) \cdot P_e(f_1) + C'_{obm}(f_1)$ where $P_e(f_1)$ denotes the power of signal $v_e(f_1)$ at frequency $f_1$;

9. use a partial correlator, with local oscillators set to select frequency $f_1$, to produce the correlation of monitor signal $v_{bm}(f_1)$ with itself; the result is $C_{bm}(f_1) = g_{bm}(f_1) \cdot g^*_{bm}(f_i) \cdot P_e(f_1)$;

10. determine the calibration constant $k_{bm1}(f_i)$ as the ratio:

$$\frac{C_{obm1}(f_1) - C'_{obm}(f_i)}{b_1' \cdot C_{bm}(f_i)};$$

11. store the calibration constants $k_{bm1}(f_1)$ and $k_{brm}(f_1)$ in nonvolatile storage in the adaptation controller.

The calibration constants $k_{bmj}(f_1)$ for j=2 to N are measured in a similar manner by first measuring the bias partial correlation $C'_{obm}(f_1)$, then selecting the jth branch and measuring the correlations $C_{obmj}(f_1)$ and $C_{bm}(f_1)$. In general, the jth branch is selected by setting $b_j$ to some nominal value $b_j'$ and setting all other CGAs to zero. The calibration constants for all the distortion cancellation branches are successively calculated for all the different subbands $f_1$ by changing the input frequency or pilot signal generator.

Once a table of calibration constants is stored in nonvolatile memory for the distortion cancellation circuit, any algorithm requiring internal cancellation branch signals can be executed on the controller. F distinct frequencies are selected to sample the distortion power spectra at different frequencies across the bandwidth of the amplifier signal. The F different frequency samples are combined with a weighting function to determine the distortion cancellation circuit correlations required for adaptation.

Adaptation algorithms, such as LS, LMS, DLMS and RLS, implemented to control the distortion cancellation circuit require one or both of the following correlations:

1. $C_{obj}$: the cross correlation of the branch signal $v_{bj}$ and the error signal $v_o$ where j is an index ranging from 1 to N. For example, LS, LMS, DLMS and RLS algorithms all require the computation of this cross correlation.
2. $C_{bpq}$: the cross correlation of the branch signal $v_{bp}$ with $v_{bq}$ where p and q are indices which can range from 1 through N. For example, $C_{b12}$ is the cross correlation of signal $v_{b1}$ and $v_{b2}$ and $C_{b11}$ is the (auto) correlation of signal $v_{b1}$ with itself. LS, DLMS and RLS are examples of algorithms that require this correlation.

The correlations $C_{obj}$ and $C_{bpq}$ are determined by a weighted sum of F partial correlations, where F is the number of subbands sampled to form the correlation estimates. For the distortion circuit adjuster d, F is greater than or equal to N.

$$C_{obj} = \sum_{i=1}^{F} w_i \cdot C_{obj}(f_i) \quad C_{bpq} = \sum_{i=1}^{F} w_i \cdot C_{bpq}(f_i) \tag{1-7}$$

The partial correlations at subband $f_1$ are determined from a time average over a block of monitor signal data in a similar manner as described before in reference to the signal cancellation circuit. Blocks of monitor signals $v_{bm}(f_1)$ and $v_o(f_1)$ are sampled simultaneously at the output of the monitor receivers. By employing the calibration data $k_{bmj}(f_1)$, the monitor branch signal $v_{bmj}(f_1)$ is transformed into N arrays of data to synthesize the internal adjuster signals $v_{bj}(f_1)$.

The partial correlations are calculated with the arrays of data stored in the adaptation controller memory by calculating a time average over $N_s$ samples.

$$C_{obj}(f_i) = \frac{1}{N_s} \cdot \sum_{n=1}^{N_s} v_{on}(f_1) \cdot v_{bmn}*(f_i) \cdot k_{bmj}*(f_i) \tag{1-8}$$

$$C_{apq}(f_i) = \frac{1}{N_s} \cdot \sum_{n=1}^{N_s} v_{bmn}(f_i) \cdot v_{bmn}*(f_i) \cdot k_{bmp}(f_i) \cdot k_{bmq}*(f_i)$$

Together equations (1–7) and (1–8) describe a method of calculating correlations $C_{obj}$ and $C_{bpq}$ from an array of F independently sampled monitor signals $v_{bm}(f_1)$ and $v_o(f_1)$. The correlations described by these equations are integrated into any general adaptation method which requires internal adjuster signal monitoring. Note also that the correlations $C_{obj}$ and $C_{bpq}$ may be averaged with their counterpart calculations derived from previously-measured arrays of samples.

The selection of the weighting functions $w_1$ in equation (1–7) depends on the desired frequency response of the distortion cancellation circuit. As described earlier with respect to the signal cancellation circuit, the choice of the subband frequencies and the choice of weights together determine the frequency response of the circuit. Two weighting functions are described as examples.

1. If a weighting function of 1 is selected for all $w_1$, then the distortion cancellation circuit frequency response depends directly on the distortion power in the selected subbands and frequency of the selected subbands.
2. If a cancellation frequency response is desired which is independent of the distortion power in the selected subbands, the partial correlations are normalized by a constant proportional to the distortion power in the corresponding subband. With a normalized weighting function, the frequency response of the cancellation circuit is approximately uniform over the bandwidth of the amplifier providing the selected subbands are equispaced over the amplifier bandwidth. A normalized weighting function may be preferred for multicarrier input signals consisting of different modulation formats.

Selection of a normalizing weight in weighting scheme 2 requires a weight proportional to $1/P_e(f_1)$. An absolute measurement of $P_e(f_i)$ or a relative measurement of $P_e(f_1)$ in terms of the $P_{bm}(f_1)$ is not easily derived from simple calibration procedures. A normalized weight in terms of the power of the reference signal $v_{br}(f_1)$ is used instead as it is easily derived from simple calibration procedures ($k_{brm}(f_1)$) and is proportional to $P_e(f_1)$.

$$w_i = \frac{1}{P_{bm}(f_i) \cdot |k_{brm}(f_i)|^2} \tag{1-9}$$

Figure 3:
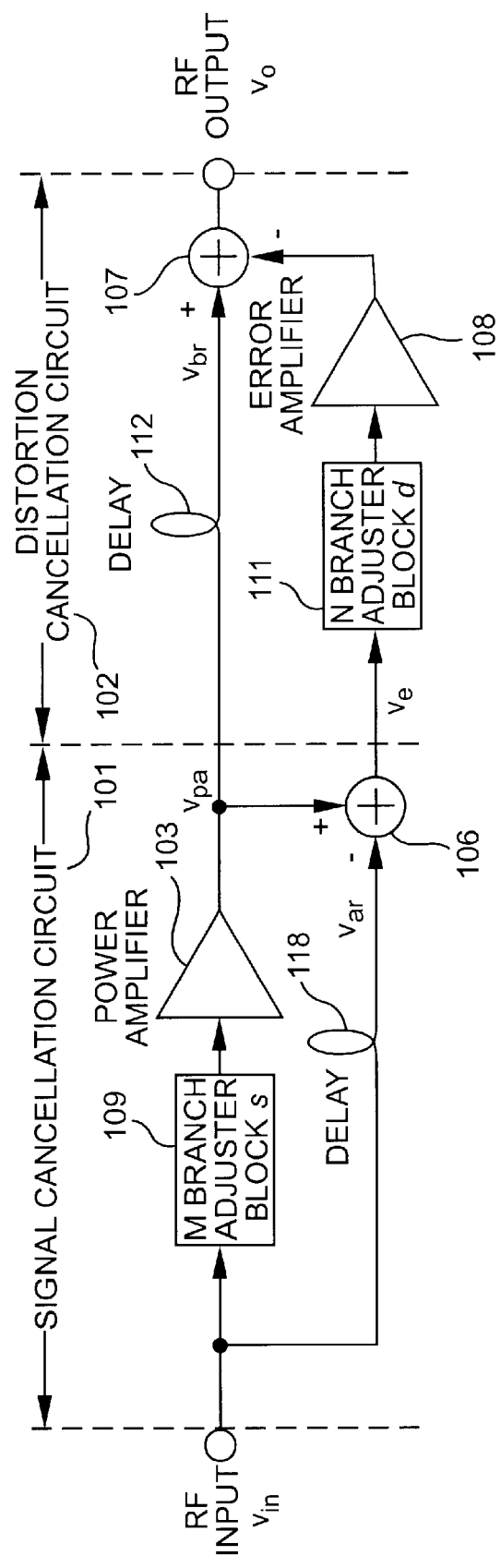
FIG. 3 is a block diagram of a multibranch feedforward linearization circuit with an adjuster circuit s in series with a power amplifier. The adjuster circuit s has M parallel circuit branches while adjuster circuit d has N parallel circuit branches.
Figure 5:
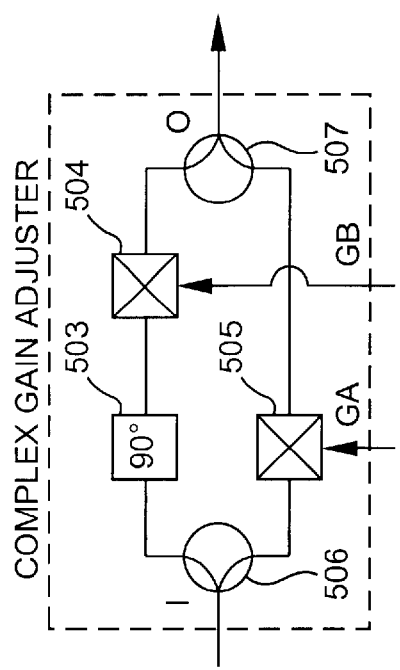
FIG. 5 is a block diagram of a complex gain adjuster employing Cartesian control parameters (GA sets the real part of the complex gain, while GB sets the imaginary part of the complex gain).
Figure 4:
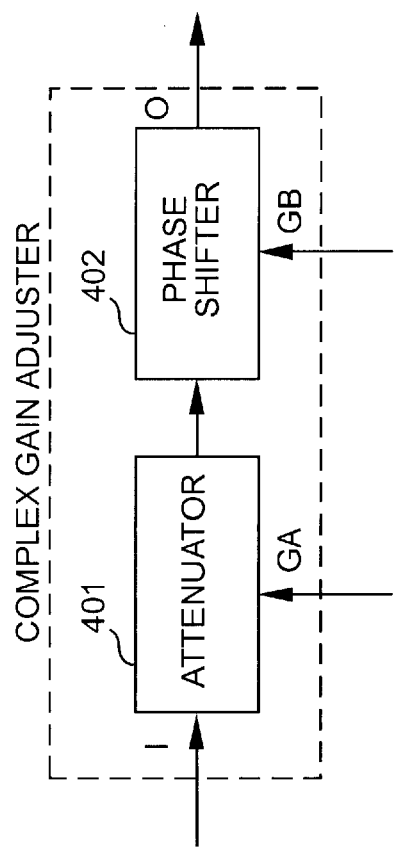
FIG. 4 is a block diagram of a complex gain adjuster employing polar control parameters (GA sets the amplitude while GB sets the phase).

For a multibranch feedforward circuit where the adjuster circuit s is in series with the power amplifier, a modified calibration procedure is required to find the calibration coefficients $k_{amj}(f_1)$. Once the calibration coefficients are measured and stored in the adaptation controller, the estimation of branch signals from monitor signals is the same as the procedure described above. An example of a calibration procedure for the series adjuster configuration is described below and includes the calculation of a calibration constant called $k_{arm}(f_1)$ relating the monitor signal $v_{am}(f_1)$ to the branch signal $v_{ar}(f_1)$ ($v_{ar}(f_1)$ is shown in FIG. 3). The following equation describes the signal cancellation 'reference' signal in terms of the monitor signal $v_{am}(f_1)$.

$$v_{ar}(f_1) = v_{am}(f_1) \cdot k_{arm}(f_1)$$

Calibration procedure to measure $k_{am1}(f_1)$ and $k_{arm}(f_1)$:

1. apply an input signal to the amplifier with a frequency component at $f_1$ or use an internal pilot signal generator set to frequency $f_1$;
2. set the power amplifier to standby mode, so that its output signal $v_{pa}$ is zero;
3. use a partial correlator, with local oscillators set to select frequency $f_1$, to produce the correlation of signal $v_e(f_1)$ with monitor signal $v_{am}(f_1)$; the result is a bias term $C'_{eam}(f_1)$;
4. set the power amplifier on
5. set the CGA gains of $a_2$ through $a_M$ to zero by appropriate choice of the control voltages, so that the CGA output is zero;
6. set the CGA gain $a_1$ to some nominal value $a_1'$ through appropriate choice of control voltages;
7. use a partial correlator (FIG. 11), with local oscillators set to select frequency $f_1$, to produce the correlation of signal $v_e(f_1)$ with monitor signal $v_{am}(f_1)$; the result is $C_{eam1}(f_1) = a_1 \cdot g*_{am}(f_1) \cdot g_{a1}(f_1) \cdot P_{in}(f_1) + C'_{eam}(f_1)$, where $P_{in}(f_1)$ denotes the power of signal $v_{in}(f_1)$ at frequency $f_1$;
8. use a partial correlator, with local oscillators set to select frequency $f_1$, to produce the correlation of monitor signal $v_{am1}(f_1)$ with itself; the result is $C_{am}(f_i) = g_{am}(f_1) \cdot g*_{am}(f_1) \cdot P_{in}(f_1)$; the ratio of $C_{am}(f_1)$ over $P_{in}(f_1)$ may also be stored in memory if normalizing weights ($w_1$) are used for summing partial correlations;

9. calculate the calibration constant $k_{arm}(f_1)$ as ratio:

$$\frac{C'_{eam}(f_i)}{C_{am}(f_i)}$$

10. determine the calibration constant $k_{am1}(f_1)$ as the ratio:

$$\frac{C_{eam1}(f_i) - C'_{eam}(f_i)}{a'_1 \cdot C_{am}(f_i)}$$

11. store the calibration constants $k_{am1}(f_1)$ and $k_{arm}(f_1)$ in nonvolatile storage in the adaptation controller.

The calibration constants $k_{amj}(f_1)$ for j=2 to M and for all subband frequencies are measured in a similar manner by isolating the jth branch and measuring the correlations $C_{eamj}(f_1)$, $C_{am}(f_1)$, and $C'_{eam}(f_1)$.

Once the calibration constants are stored in nonvolatile memory, the adaptation controller determines internal branch signals in the same way as described above. The selection of the weights, $w_1$ in equations (1–2) are identical to the methods described above with the exception of equation (1–5) which is written in terms of the reference branch signal $v_{br}(f_1)$ instead of the amplifier signal $v_{pa}(f_i)$.

$$w_i = \frac{1}{P_{am}(f_i) \cdot |k_{arm}(f_i)|^2} \quad (1\text{-}10)$$

Those skilled in the art will recognize modifications to this method which simplify the amount of memory required to store sampled data and calculate partial correlation estimates. Examples of modifications to the method include but are not limited to:

1. computation of the partial correlation at each $f_i$ after the data is sampled; i.e.: store the required partial correlations at frequency $f_i$ rather than storing arrays of sampled monitor signals and then computing partial correlations for all sampled subbands;
2. the division by $N_S$ in the time averaged estimates may be eliminated if it cancels in the adaptation algorithm expressions.

RF amplifiers using linearizers having an architecture in accordance with the present invention may achieve a high degree of intermodulation (IM) suppression, i.e., distortion cancellation. For example, a linearizer with a two branch adjuster in the signal and distortion cancellation circuits (M=2 and N=2) has shown the following performance:
  at least 35 db of distortion cancellation over a 15 MHz bandwidth;
  at least 35 dB of distortion cancellation over a 25 MHz bandwidth;
  at least 25 dB of distortion cancellation over a 60 MHz bandwidth; and
  at least 20 dB of distortion cancellation over a 75 MHz bandwidth.

These results are exemplary, and may vary substantially about the recited distortion cancellation figures depending on the specific design of the linearizer circuit. Three or more branches in the signal adjusters are expected to provide distortion cancellation for a bandwidth greater than 75 MHz. It is predicted that a circuit with three branch signal adjusters (M=3 and N=3) will achieve approximately 20 dB of distortion cancellation over a 100 Mhz bandwidth. In addition, the numbers recited above for distortion cancellation are minimums, and distortion cancellation will be better at different locations within the band. The above variations in distortion cancellation are within the scope of the present invention.

The bandwidths for the above RF amplifiers correspond to the following wireless communication systems in North America and Europe:
  North America Wireless Frequency Bands
    Cellular (800 MHz band):
      Downlink: 880–894 MHz (including expanded A and B bands);
      Uplink: 835–849 MHz; and
      Amplifier bandwidth: 14 MHz.
    PCS/DCS-1900 (1900 MHz band):
      Downlink: 1930–1990 MHz, subdivided into six blocks (A–F) of 5 MHz or 15 MHz;
      Uplink: 1850–1910 MHz; and
      Amplifier bandwidths: 5 MHz, 15 MHz, 60 MHz.
    UMTS (2100 MHz band): 60 MHz amplifier bandwidth.
  European Wireless Frequency Bands
    900 MHz GSM:
      Downlink: 935–960 MHz
      Uplink: 890–915 MHz; and
      Amplifier bandwidth: 25 MHz.
    PCN or DCS-1800
      Downlink: 1800–1880 MHz
      Uplink: 1710–1785 MHz; and
      Amplifier bandwidth: 75 MHz.

Accordingly, the improvement in distortion cancellation obtained, or obtainable, by the linearizers having the architecture of the present invention are directly applicable to current wireless communication systems.

As will be apparent to those skilled in the art in light of the foregoing disclosure, many alterations and modifications are possible in the practice of this invention without departing from the spirit or scope thereof. Accordingly, the scope of the invention is to be construed solely by the following claims.

What is claimed is:

1. An amplifier linearizer comprising:
  a signal cancellation circuit including a signal adjuster having M branch signals (M>1); and
  a controller for adaptively controlling said M-branch signal adjuster, said controller including only one monitor receiver to monitor the M branch signals, wherein said monitor receiver accounts for a difference between a signal associated with said signal adjuster and a monitor signal, the monitor signal being an unequal representation of the associated signal.

2. An amplifier linearizer comprising:
  a distortion cancellation circuit including a signal adjuster having N branch signals (N>1); and
  a controller for adaptively controlling said N-branch signal adjuster, said controller including only one monitor receiver to monitor the N branch signals, wherein said monitor receiver accounts for a difference between a signal associated with said signal adjuster and a monitor signal, the monitor signal being an unequal representation of the associated signal.

3. An amplifier linearizer comprising:
  a signal cancellation circuit including a signal adjuster having M branch signals (M>1);
  a distortion cancellation circuit including a signal adjuster having N branch signals (N≧4); and
  a controller for adaptively controlling said M-branch signal adjuster and said N-branch signal adjuster, said controller including only one monitor receiver to monitor the M branch signals and only one monitor receiver to monitor the N branch signals, wherein said M-branch monitor receiver accounts for a difference between a signal associated with said M-branch signal adjuster and a M-branch monitor signal, the M-branch monitor signal being an imperfect representation of the signal associated with said M-branch signal adjuster, and wherein said N-branch monitor receiver accounts for a difference between a signal associated with said N-branch signal adjuster and a N-branch monitor signal, the N-branch monitor signal being an unequal representation of the signal associated with said N-branch signal adjuster.

4. An amplifier linearizer comprising:

a signal cancellation circuit including a signal adjuster having M branch signals (M>1); and a local oscillator for producing a plurality of pilot tones to guide adaptation of said signal adjuster.

5. An amplifier linearizer comprising:

a signal cancellation circuit including a signal adjuster having M branch signals (M≧1); and a distortion cancellation circuit including a signal adjuster having N branch signals (N>1); and a controller for adaptively controlling said M-branch signal adjuster and said N-branch signal adjuster, said controller including only one monitor receiver to monitor the M branch signals and only one monitor receiver to monitor the N branch signals, wherein said M-branch monitor receiver accounts for a difference between a signal associated with said M-branch signal adjuster and a M-branch monitor signal, the M-branch monitor signal being an imperfect representation of the signal associated with said M-branch signal adjuster, and wherein said N-branch monitor receiver accounts for a difference between a signal associated with said N-branch signal adjuster and a N-branch monitor signal, the N-branch monitor signal being an unequal representation of the signal associated with said N-branch signal adjuster.

6. An amplifier linearizer according to claim 1, further comprising a distortion cancellation circuit including a signal adjuster having N branch signals (N≧1).

7. An amplifier linearizer according to claim 2, further comprising a signal cancellation circuit including a signal adjuster having M branch signals (M≧1).

* * * * *